(12) United States Patent
Chen

(10) Patent No.: US 7,466,611 B1
(45) Date of Patent: Dec. 16, 2008

(54) SELECTION METHOD OF BIT LINE REDUNDANCY REPAIR AND APPARATUS PERFORMING THE SAME

(75) Inventor: Chung Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 11/767,154

(22) Filed: Jun. 22, 2007

(51) Int. Cl.
*G11C 7/00* (2006.01)

(52) U.S. Cl. .............. 365/200; 365/230.03; 365/225.7

(58) Field of Classification Search ............. 365/200, 365/230.03, 225.7
See application file for complete search history.

(56) References Cited

U.S. PATENT DOCUMENTS 6,041,006 A * 3/2000 Tsuchiya ............... 365/230.03
6,246,618 B1 * 6/2001 Yamamoto et al. .......... 365/200
7,075,848 B2 * 7/2006 Choi et al. ............... 365/225.7
2005/0207244 A1   9/2005 Takenaka

* cited by examiner

*Primary Examiner*—Huan Hoang
(74) *Attorney, Agent, or Firm*—Connolly Bove Lodge & Hutz LLP

(57) ABSTRACT

A selection method of bit line redundancy repair includes the steps of providing a plurality of logical addresses of memory blocks in the normal cell array, generating a plurality of extra fuse signals, generating a code based on states of the extra fuse signals, the code matching a defective type of the memory blocks, and selecting a plurality of redundancy blocks in the redundancy cell array to replace the memory blocks according to the code. The apparatus includes a redundancy repair enable circuit for generating a redundancy enable signal based on logical addresses of the memory blocks, a controlling fuse circuit for sending a code matching a defective type of the memory blocks, and a redundancy decoder circuit for receiving the redundancy enable signal and the code to replace a plurality of memory blocks in the normal cell array with redundancy blocks.

20 Claims, 20 Drawing Sheets

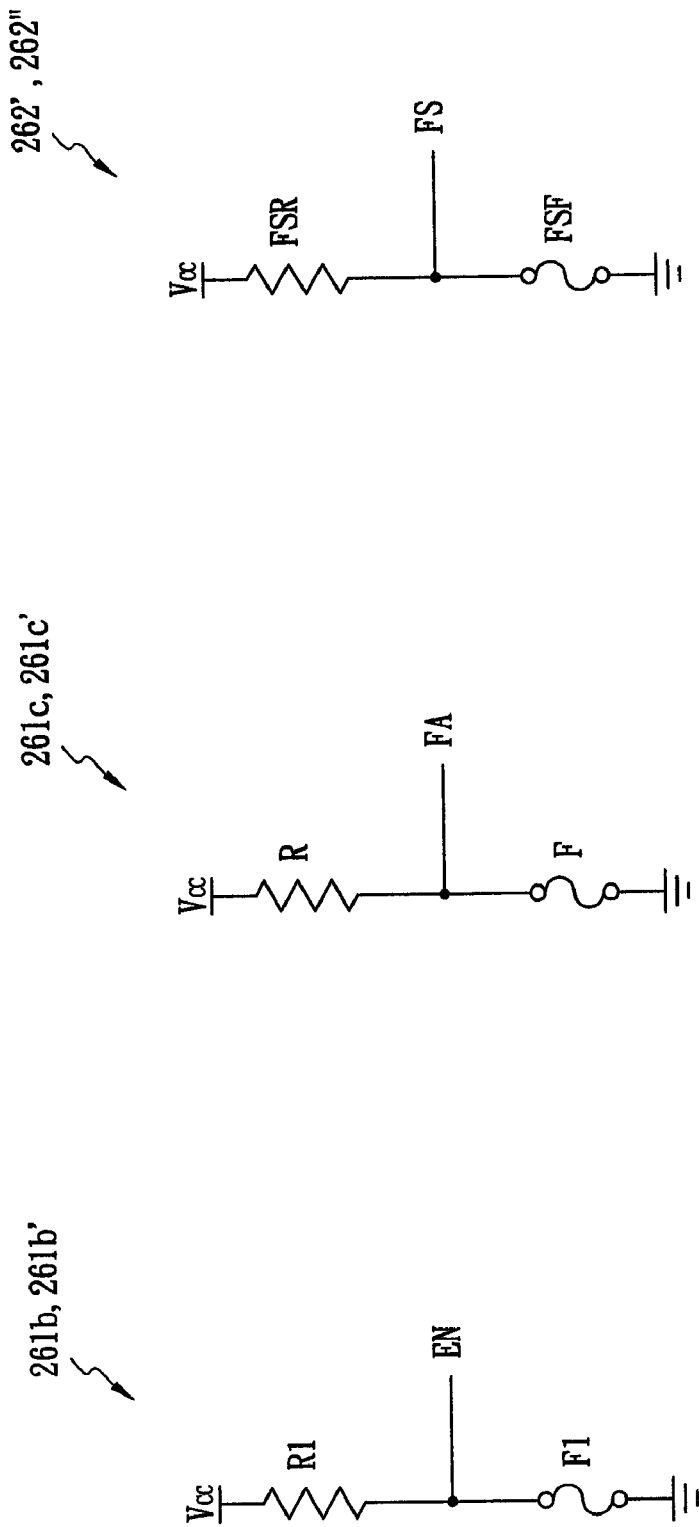

SELECTION METHOD OF BIT LINE REDUNDANCY REPAIR AND APPARATUS PERFORMING THE SAME

BACKGROUND OF THE INVENTION

1. Field of the Invention

The present invention relates to a selection method of bit line redundancy repair and an apparatus performing the same, and more particularly, to a selection method of bit line redundancy repair with flexible repair capability and an apparatus performing the same.

2. Description of the Related Art

After the manufacturing of semiconductor memory devices, various tests are conducted to determine whether or not the circuits on the semiconductor memory devices operate in conformity with predetermined specifications. Multiple test parameters are used in each test to check the electrical properties and operation of the circuits. When any of the circuits within the semiconductor memory device is found to have a defect, a remedial measure for such a defect for the semiconductor memory device may not be possible. If a portion of normal memory cells is determined to be in a defective state, then such portion of the memory cells can be replaced with a redundant memory cell so that the semiconductor memory device can operate normally. In other words, to correct the defect, a redundancy circuit including fuses that are meltable by a high-energy light such as laser etc., is fabricated together with the memory cell and circuit devices of the semiconductor memory devices during its manufacturing process.

In U.S. Pat. Publication No. US2005/0207244, herein incorporated by reference and hereinafter '244, a semiconductor memory device 1 carrying out redundancy repair is disclosed, as shown in FIG. 1. The semiconductor memory device 1 includes a normal cell array 11, a redundant cell array 12, a cell drain selection circuit 13, a column decoder circuit 14, a defective cell block column redundancy selection circuit 15, an adjacent cell block column redundancy selection circuit 16, and a row decoder circuit 18. FIG. 2 shows a circuit diagram of the normal and redundant cell arrays in FIG. 1. The normal cell array 11 has 16×8 memory cell transistors, sixteen of which (ML0, MR0, ML1, MR1 . . . ML7, MR7) receive word line select signal WL1. Current is supplied to the normal cell array 11 through memory cell drain select transistors MDSL0, MDSL1 . . . MDSL7; data signals are read out through column switch transistors MBL0, MBL1 . . . MBL7. In the normal cell array 11, normal cells ML2, MR2, ML3, MR3 and other normal cells in the same columns constitute one cell block 110. Similarly, normal cells ML0, MR0, ML1, MR1 and other normal cells in the same columns constitute another cell block; normal cells ML4, MR4, ML5, MR5 and other normal cells in the same columns constitute still another cell block; normal cells ML6, MR6, ML7, MR7 and other normal cells in the same columns constitute yet another cell block (the columns including cells ML5, MR5, ML6, MR6, and ML7 are not shown). The redundant cell array 12 includes 8×8 redundant cells containing redundant memory cell transistor (redundant cells), eight of which (RML0, RMR0, RML1, RMR1 . . . , RML3, RMR3) receive word line select signal WL1. Current is supplied to the redundant cell array 12 through redundant memory cell drain select transistors RMDSL0, RMDSL1, RMDSL2 . . . RMDSL4; data signals are read out through redundant column switch transistors RMBL0, RMBL1 . . . RMBL3. In redundant cell array 12, redundant cells RML0, RMR0, RML1, RMR1 and other redundant cells in the same redundant columns constitute a first redundant cell block 120 for replacing a defective cell block (e.g., cell block 110) in the normal cell array 11. Redundant cells RML2, RMR2, RML3, RMR3 and other redundant cells in the same columns constitute a second redundant cell block 121 for replacing a non-defective cell block adjacent to the defective cell block. More accurately, one or two non-defective half-blocks can be replaced. For example, if cell block 110 is defective, the memory cells in redundant cell block 121 may be used to replace adjacent half-block 111 (located to the left of cell block 110), adjacent half-block 112 (located to the right of cell block 110), or both adjacent half-blocks 111 and 112.

FIG. 3 shows an exemplary circuit structure of the defective cell block column redundancy selection circuit 15 in FIG. 1, which generates the column select signals RY0 and RY1 for the first redundant cell block 120. The defective cell block column redundancy selection circuit 15 includes three fuse-programmable circuits 150-152, two address selection circuits 153 and 154, and an address decoding circuit 155. The fuse-programmable circuit 150 generates a redundancy enable signal FMAIN that is programmed to the high logic level when redundancy repair is necessary and to the low logic level when redundancy repair is not necessary. When redundancy repair is necessary, the fuse-programmable circuits 151 and 152 store the address of the defective cell block. The fuse-programmable circuits 150-152 have identical structures, each including a resistor and a fuse. In the fuse-programmable circuit 150, for example, one end of the resistor R50 is connected to a power supply node $V_{cc}$, one end of the fuse F50 is connected to the other end of the resistor R50, and the other end of the fuse F50 is connected to a ground node. The redundancy enable signal FMAIN is outputted from a node at which the resistor R50 and the fuse F50 are interconnected. A fuse-programmable address signal FY2 is outputted from a node at which the resistor (not shown) and the fuse (not shown) in the fuse-programmable circuit 151 are interconnected. Another fuse programmable address signal FY3 is outputted from a node at which the resistor (not shown) and the fuse (not shown) in the fuse-programmable circuit 152 are interconnected. The address selection circuits 153 and 154 are identically structured as exclusive-NOR (EXNOR) gates, each including a pair of inverters I50, I51 and a pair of MOS switches M50 and M51. Each address selection circuit 153 (or 154) compares one address bit AY2 (or AY3) with one fuse programmable address signal FY2 (or FY3) and generates a redundant column address signal FA2 (or FA3). The redundant column address signal FA2 (or FA3) is high if the address bit AY2 (or AY3) and fuse programmable address signal FY2 (or FY3) have the same logic levels, and low if they have different logic levels. Therefore, the column select signal RY0 or RY1 is actuated to the high logic level to initiate the bit line redundancy repair only when the fuse programmable address signal FY2 (or FY3) and the address bit AY2 (or AY3) have the same logic level, and the redundancy enable signal FMAIN has the high logic level according to the defective cell block column redundancy selection circuit 15 in FIG. 3.

FIG. 4(a) shows a schematic representation of the circuit structure of the defective cell bock column redundancy selection circuit 15 in FIG. 3. FIG. 4(b) shows a similarly schematic representation of the circuit structure of the adjacent cell block column redundancy selection circuit 16 in FIG. 1. The adjacent cell block column redundancy selection circuit 16 includes fuse-programmable circuits 156, 157, adjacent address generating circuits 160, 161, 162, 163, 164, 165, address selection circuits 166, 167, 168, 169, 170, 171, and address decoding circuits 172, 173. The fuse-programmable circuit 156, the adjacent address generating circuits 160, 161, 162, the address selection circuits 166, 167, 168, and the address decoding circuit 172 constitute an upper column redundancy selection circuit 174; the fuse-programmable circuit 157, the adjacent address generating circuits 160, 161, 162, the address selection circuits 163, 164, 165, and the address decoding circuit 173 constitute a lower column redundancy selection circuit 175. The upper and lower column redundancy selection circuits 174 and 175 generate an upper redundant column selection signal RYU and a lower redundant column selection signal RYD to select the left half and the right half of the redundant cell blocks 121 to replace the normal adjacent half-blocks 112 and 111, respectively.

To achieve the replacement of the defective cell block 110 and two adjacent half-blocks 111 and 112, the defective cell block column redundancy selection circuit 15 and the adjacent cell block column redundancy selection circuit 16 are required. That is, nine fuses (three fuses in each of the defective cell block column redundancy selection circuit 15, the upper column redundancy selection circuit 174 and the lower column redundancy selection circuit 175) are required to implement the bit line redundancy repair. Consequently, a large area for these fuses is occupied in the semiconductor device, especially in the NAND flash application, which needs large amount of redundancy (around 1%-2% redundancy bit line) to maintain acceptable product yield.

SUMMARY OF THE INVENTION

One aspect of the present invention is to provide a selection method of bit line redundancy repair and an apparatus performing the same, which employ fewer fuses to generate a code to select plural redundancy blocks to replace the corresponding memory blocks. Accordingly, the fuse-occupying area is reduced and the laser repair operation time is improved.

Another aspect of the present invention is to provide a selection method of bit line redundancy repair and an apparatus performing the same, which employ a code resulting from plural fuse states and logic addresses of memory blocks, to perform flexible bit line redundancy repair.

The present invention discloses a selection method of bit line redundancy repair, which is applied to a semiconductor memory device including a normal cell array and a redundancy cell array. The selection method includes the steps of providing a plurality of logical addresses of memory blocks in the normal cell array, generating a plurality of extra fuse signals, generating a code from states of the extra fuse signals and the MSB (Most Significant Bit) of logical addresses of the memory blocks in the normal cell array, the code matching a defective type of the memory blocks, and selecting a plurality of redundancy blocks in the redundancy cell array to replace the memory blocks according to the code.

The present invention also discloses an apparatus performing the selection method of bit line redundancy repair. The apparatus performing bit line redundancy repair includes a redundancy repair enable circuit, a controlling fuse circuit, and a redundancy decoder circuit. The redundancy repair enable circuit is configured to generate a redundancy enable signal based on the logical address of the memory blocks. The controlling fuse circuit is configured to send a code matching a defective type of the memory blocks. The redundancy decoder circuit is configured to receive the redundancy enable signal and the code to generate a plurality of redundancy selection signals selecting a plurality of redundancy blocks in the redundancy cell array to replace a plurality of memory blocks in the normal cell array. The physical addresses of the memory blocks and the logical addresses of the memory blocks are different from each other. During the bit line redundancy repair, the replaced memory blocks may be normal or defective.

BRIEF DESCRIPTION OF THE DRAWINGS

The invention will be described according to the appended drawings in which:

FIG. 7(b) shows an enable fuse circuit;

FIG. 7(c) shows a fuse state circuit;

FIG. 8 shows a fuse indication circuit;

DETAILED DESCRIPTION OF THE INVENTION

Figure 5A:
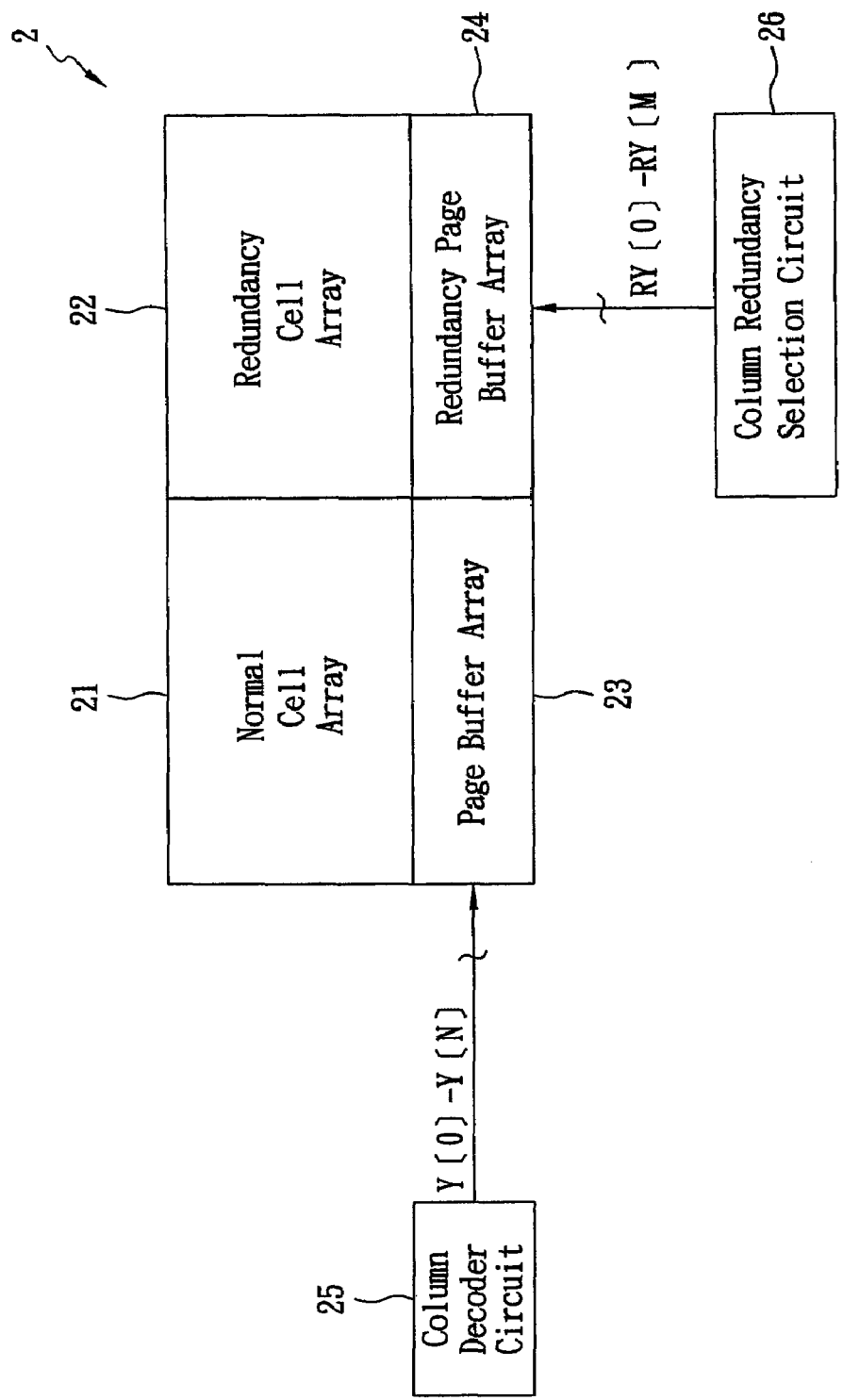
FIG. 5(a) shows a functional block diagram of a semiconductor memory device carrying out bit line redundancy repair according to the present invention.
Figure 5B:
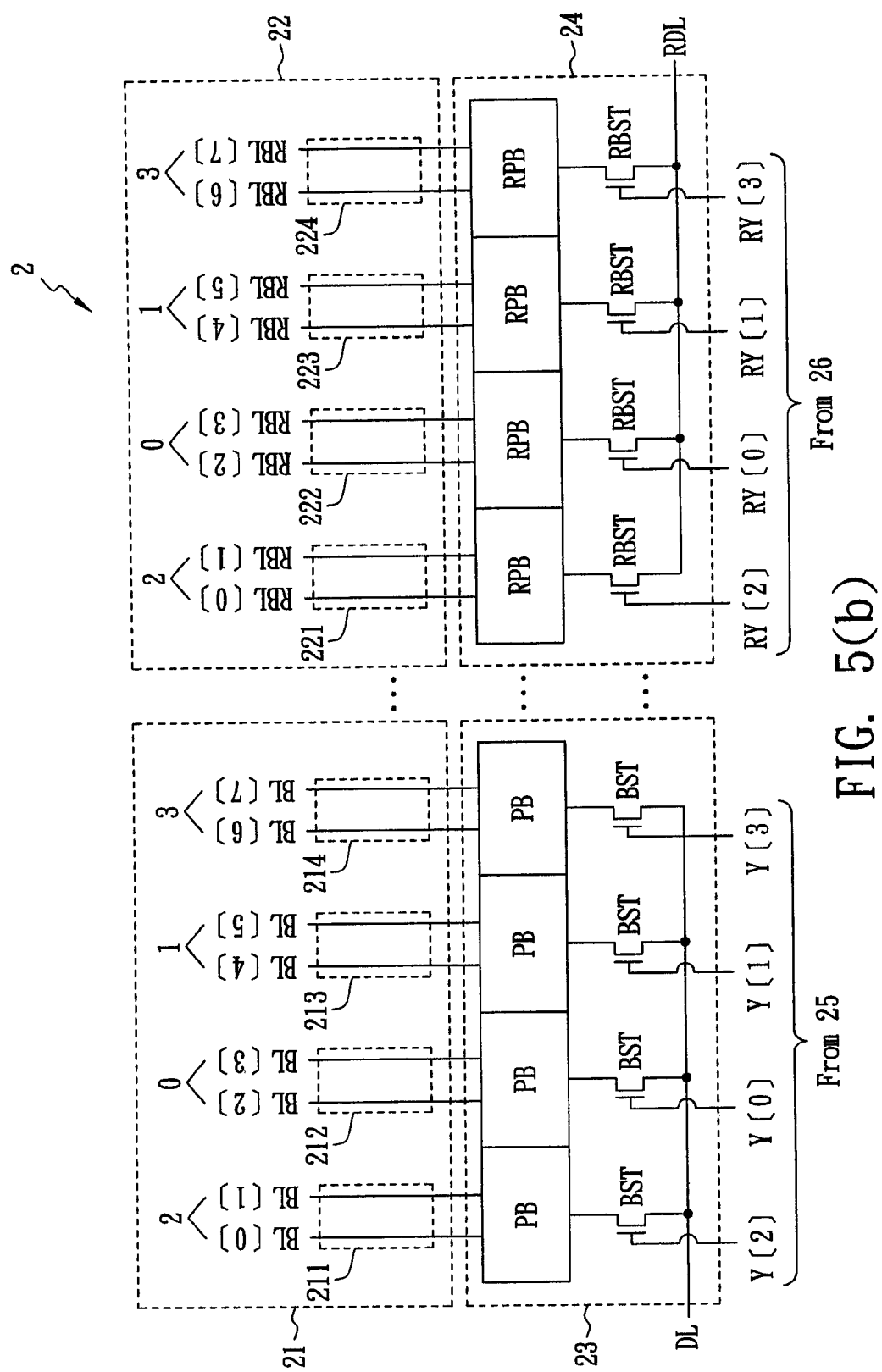
FIG. 5(b) shows an embodiment of the semiconductor memory device in FIG. 5(a)

FIG. 5(a) shows a functional block diagram of a semiconductor memory device 2 carrying out bit line redundancy repair according to the present invention. FIG. 5(b) shows an embodiment of the semiconductor memory device 2 in FIG. 5(a). The semiconductor memory device 2 (a NAND flash memory device in the current embodiment) includes a normal cell array 21, a redundancy cell array 22, a page buffer array 23, a redundancy page buffer array 24, a column decoder circuit 25 and a column redundancy selection circuit 26. The page buffer array 23 includes plural page buffers PB serving read/write interfaces for memory blocks 211-214, which have memory cells associated with the memory cells (not shown), in the normal cell array 21. The redundancy page buffer array 24 includes plural redundancy page buffers RPB serving read/write interfaces for redundancy blocks 221-224, which have redundancy memory cells (not shown), in the redundancy cell array 22. The column decoder circuit 25 generates plural column select signals Y[0]-Y[N], which have the similar function of the column select signals RY0 and RY1 in FIG.

Figure 1:
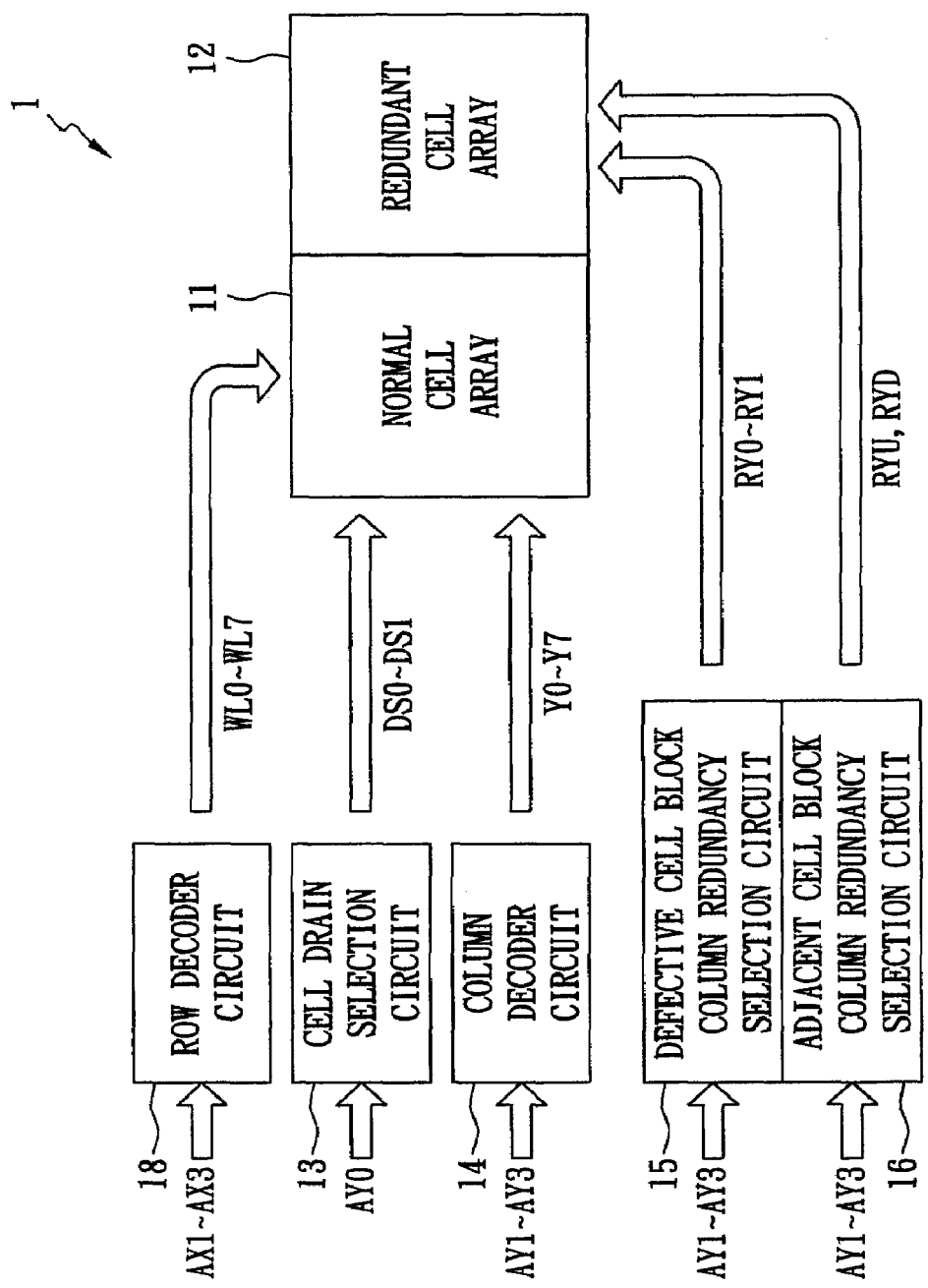
FIG. 1 shows a semiconductor memory device carrying out redundancy repair as disclosed in the prior art.
Figure 2:
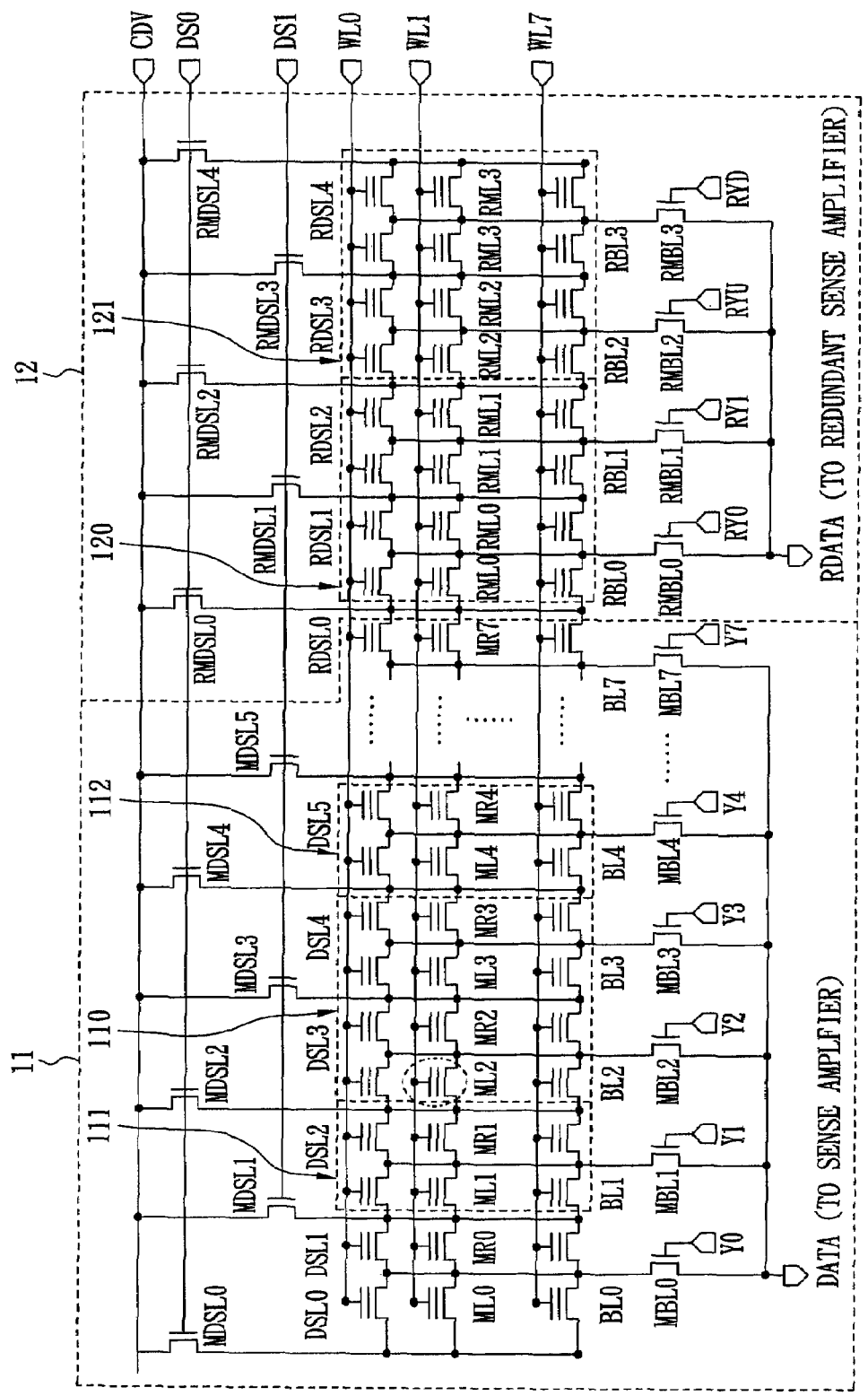
FIG. 2 shows a circuit diagram of the normal and redundant cell arrays in FIG. 1.
Figure 3:
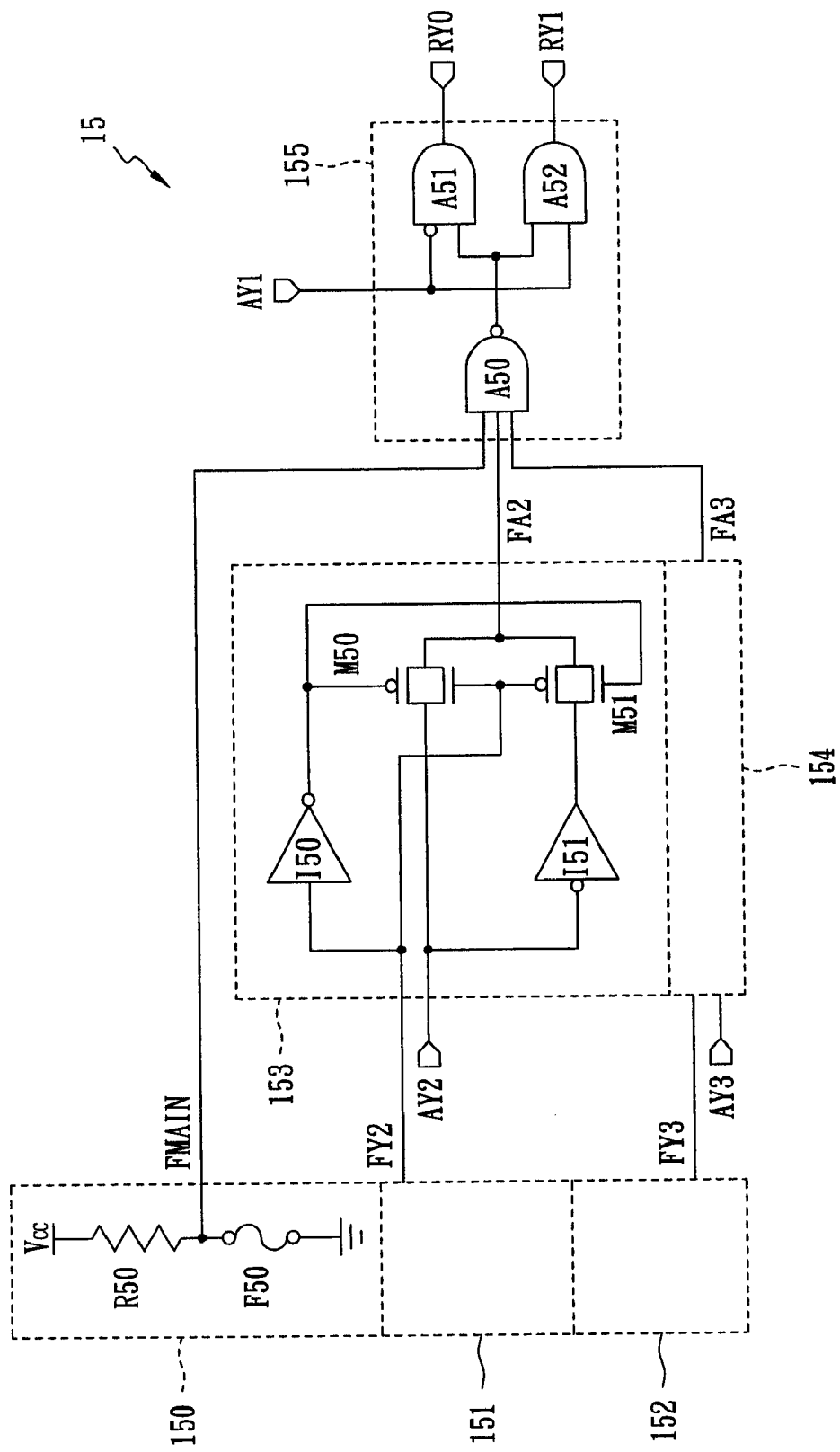
FIG. 3 shows an exemplary circuit structure of the defective cell block column redundancy selection circuit in FIG. 1.
Figure 4A:
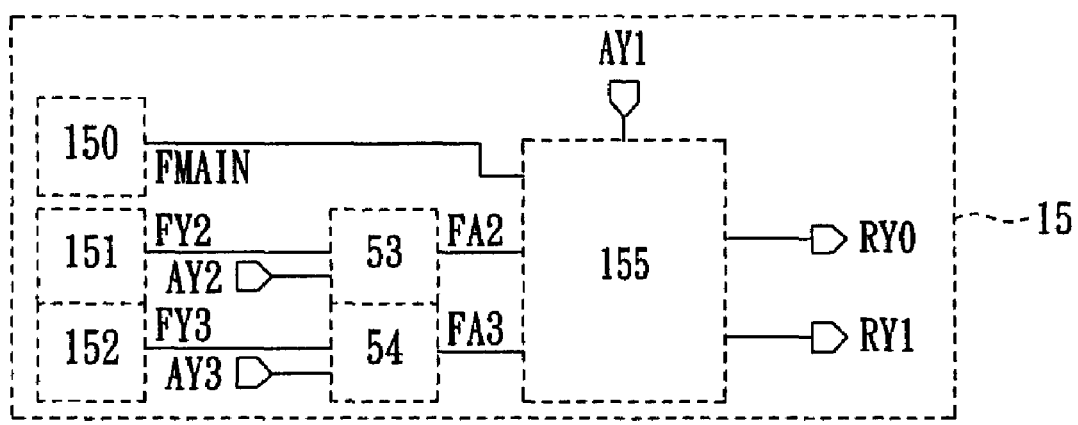
FIG. 4(a) shows a schematic representation of the circuit structure of the defective cell bock column redundancy selection circuit in FIG. 3.
Figure 4B:
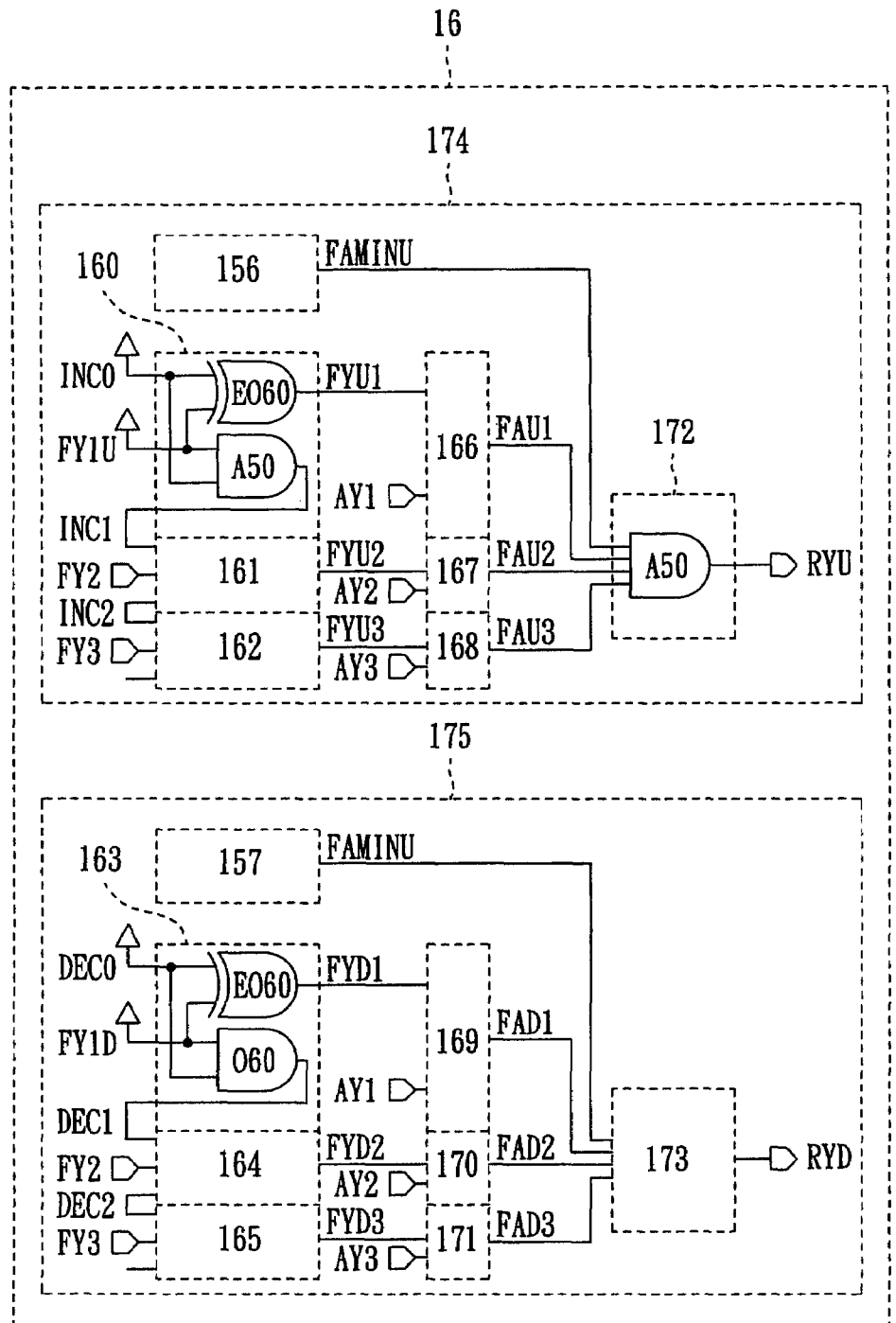
FIG. 4(b) shows a similarly schematic representation of the circuit structure of the adjacent cell block column redundancy selection circuit in FIG. 1.
Figure 5C:
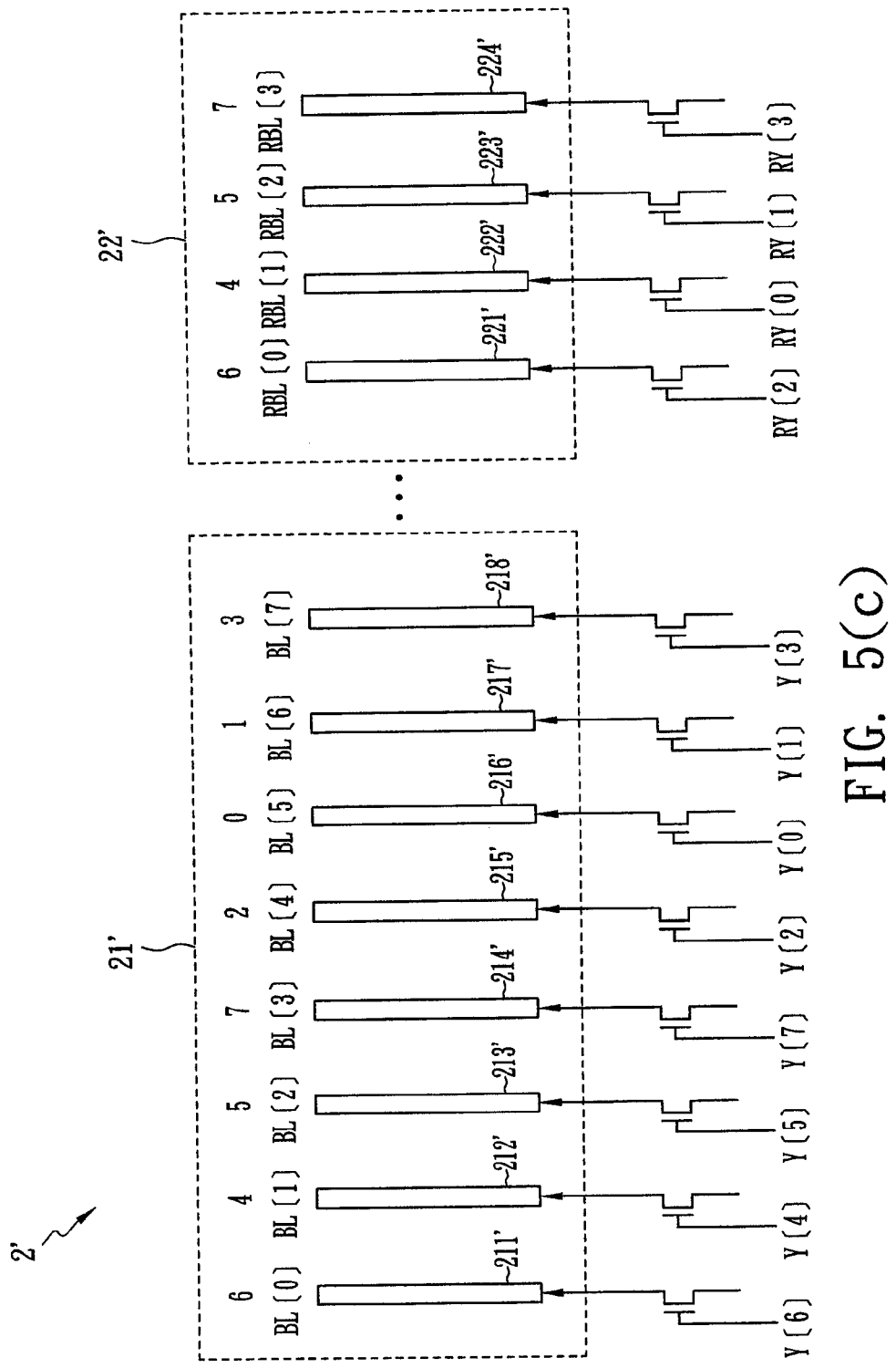
FIG. 5(c) shows another embodiment of the semiconductor memory device in FIG. 5(a)

2, to gate electrodes of bit switch transistors BST, which are similar to the column switch transistors MBL0, MBL1 . . . MBL7 in FIG. 2, to select some of the memory blocks 211-214 to be replaced by the corresponding redundancy blocks in the redundancy cell array 22. The column redundancy selection circuit 26 generates plural redundancy selection signals RY[0]-RY[M], which are similar to the column select signals RY0 and RY1, and the upper/lower redundant column selection signals RYU and RYD, to gate electrodes of redundancy bit switch transistors RBST to initiate the bit line redundancy repair. A data line DL and a redundancy data line RDL connected to the bit switch transistors BST and the redundancy bit switch transistors RBST, respectively, communicate data during the bit line redundancy repair. Note that only four memory blocks 211-214 and four redundancy blocks 221-224 and their corresponding page buffers PB and redundancy page buffers RPB are shown in FIG. 5(b). In the current embodiment, each memory block comprises two bit lines BL (in the NAND flash memory device, one of the two bit lines serves as a shielding bit line for shielding purpose). All the bit lines BL are arranged with physical addresses from BL[0] to BL[7] and with logical address of 2, 0, 1 and 3, wherein one logical address indicates two bit lines in one memory block. Also, the redundancy blocks 221-224 have the same arrangement as the memory blocks 211-214. FIG. 5(c) shows another embodiment of the semiconductor memory device 2 in FIG. 5(a). The structure of the semiconductor memory devices 2' is similar to that of the semiconductor memory devices 2. The semiconductor memory device 2' includes a normal cell array 21', a redundancy cell array 22', a page buffer array (not shown), and a redundancy page buffer array (not shown). The column selection decoding circuit 22' receives the column select signals Y[0]-Y[7] to select some of the memory blocks 211'-218' to be replaced. The redundancy selection decoding circuit 22" receives the redundancy selection signals RY[0]-RY[3] to select some of the redundancy blocks 221'-224' in redundancy cell array 22' to replace the corresponding memory blocks in normal cell array 21'. Note that only eight memory blocks 211'-218' and four redundancy blocks 221'-224' are shown in FIG. 5(c). Additionally, the semiconductor memory device 2' in FIG. 5(c) could be considered an expansion of the semiconductor memory device 2 in FIG. 5(b).

Figure 6:
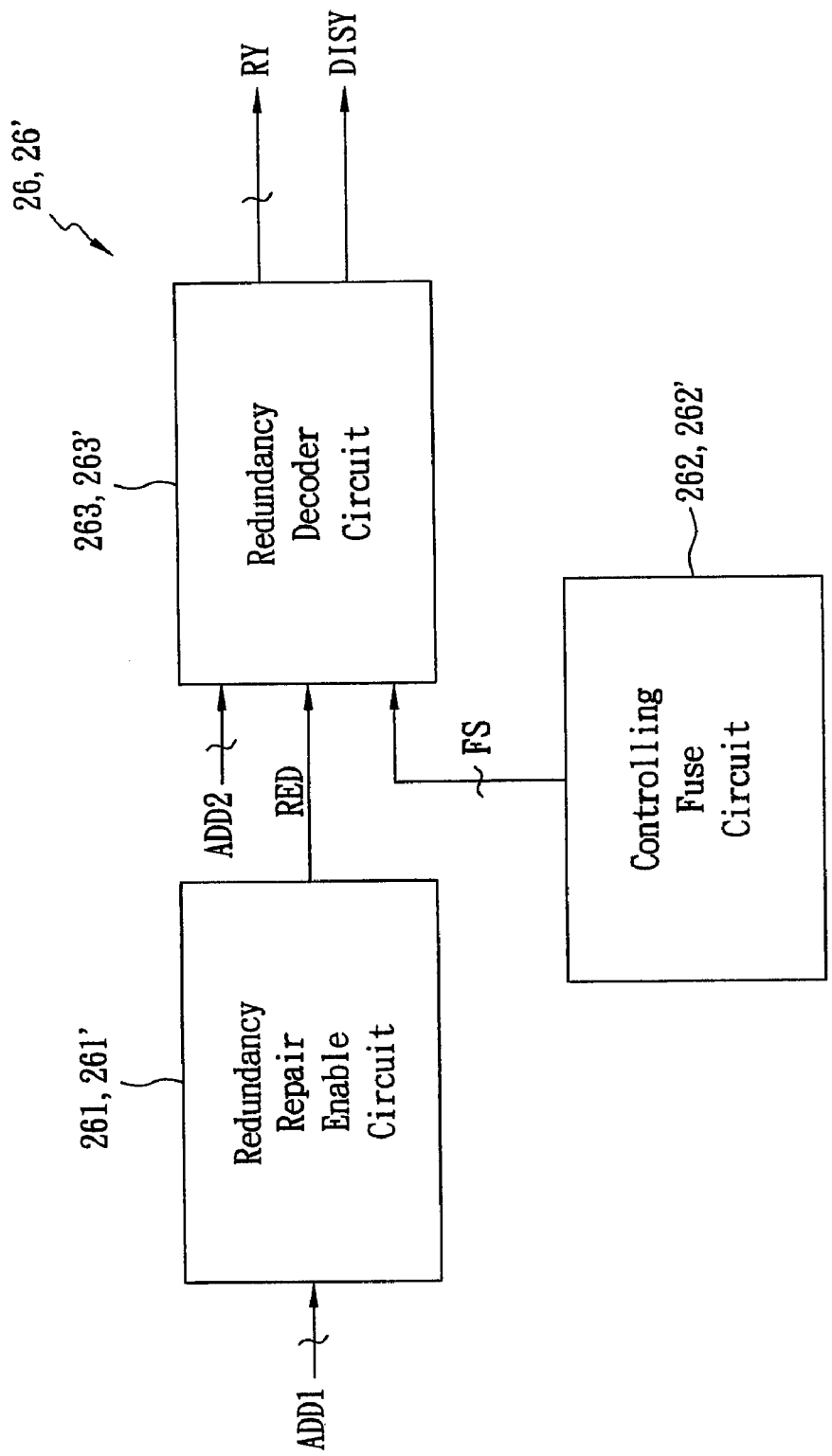
FIG. 6 shows the first and second embodiments of the column redundancy selection circuit according to the present invention.
Figure 9A:
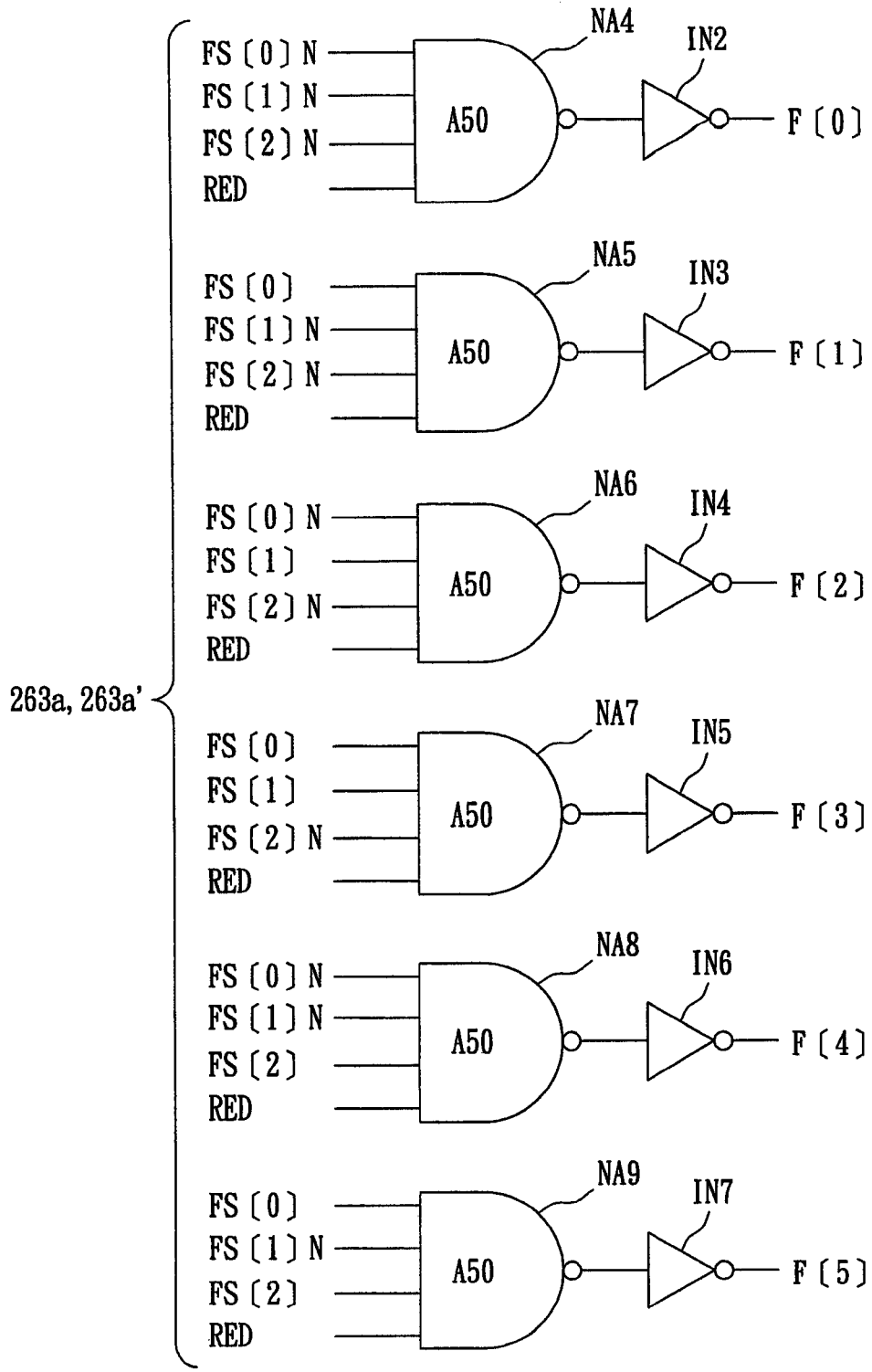
FIG. 9(a) shows six first coding circuits.
Figure 9D:
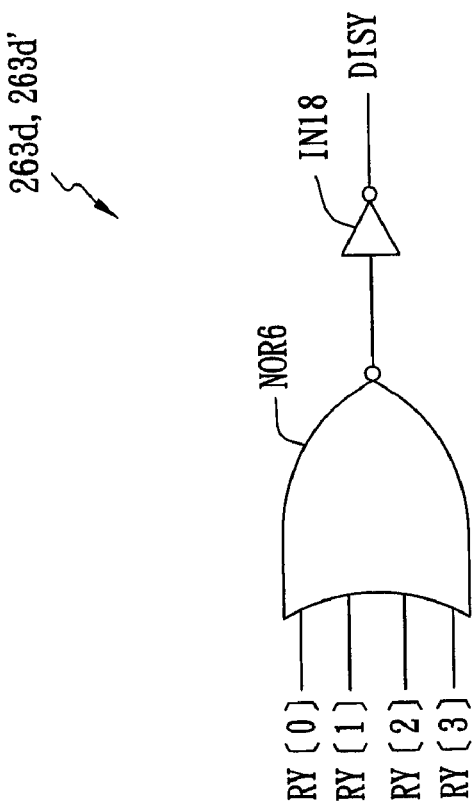
FIG. 9(d) shows a third coding circuit.
Figure 9B:
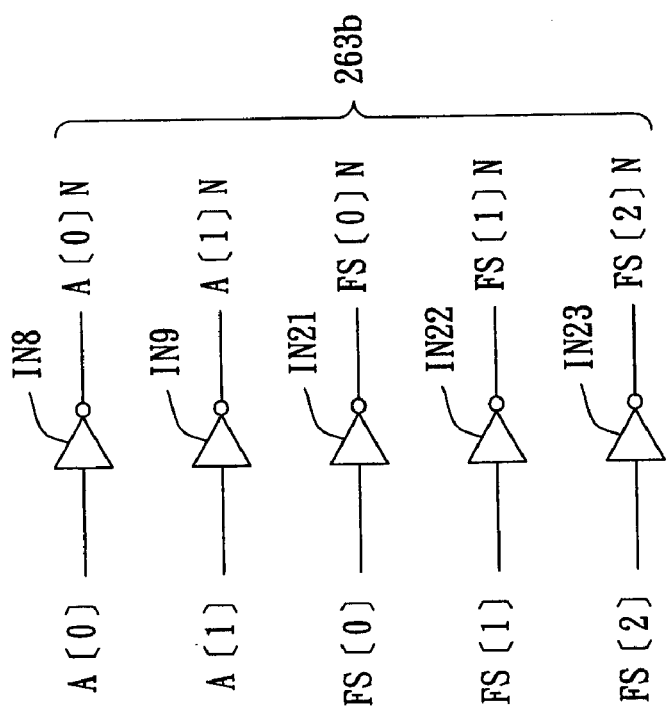
FIG. 9(b) shows an embodiment of inverter circuits.
Figure 9C:
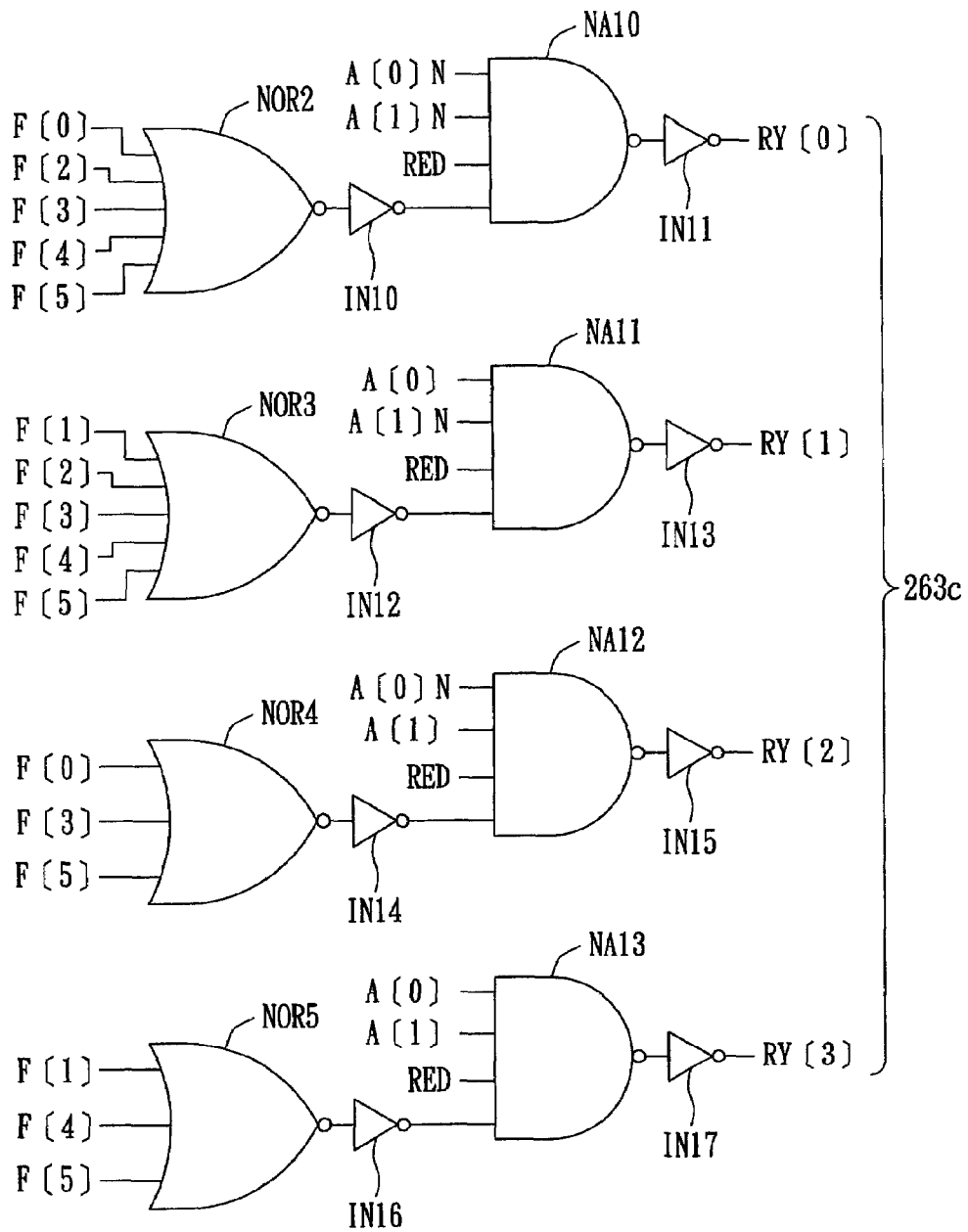
FIG. 9(c) shows four second coding circuits.

FIG. 6 shows the first embodiment of the column redundancy selection circuit 26, which is applied to the semiconductor memory device 2 in FIG. 5(b), according to the present invention. The column redundancy selection circuit 26 includes a redundancy repair enable circuit 261 generating a redundancy enable signal RED based on logical addresses ADD1 of the memory blocks, a controlling fuse circuit 262 sending a code matching a defective type of the memory blocks, and a redundancy decoder circuit 263 receiving the redundancy enable signal RED, logical addresses ADD2 of the memory blocks and the code to generate a plurality of redundancy selection signals RY selecting a plurality of redundancy blocks in the redundancy cell array 22 to replace a plurality of memory blocks in the normal cell array 21. In the current embodiment, the redundancy repair enable circuit 261 includes a redundancy enable circuit 261a (refer to FIG. 7(a)), an enable fuse circuit 261b (refer to FIG. 7(b)), and three fuse state circuits 261c (refer to FIG. 7(c)). The enable fuse circuit 261b includes a resistor R1 and a fuse F1 connected in serial, and the resistor R1 and the fuse F1 are disposed between the power supply node $V_{cc}$ and the ground node to generate an enable fuse signal EN. The fuse state circuit 261c includes a resistor R and a fuse F connected in series, and the resistor R and the fuse F are disposed between the power supply node $V_{cc}$ and the ground node to generate a fuse state signal FA. Thus, the three fuse state circuits 261c generate three fuse state signals FA[2]-FA[4]. The redundancy enable circuit 261a receives the enable fuse signal EN, the three fuse state signals FA[2]-FA[4] and three bits A[2]-A[4] of the logical addresses (indicated as ADD1 in FIG. 6) of the memory blocks. When the bit A[2] is equal to the fuse state signal FA[2], the bit A[3] is equal to the fuse state signal FA[3], and the bit A[4] is equal to the fuse state signal FA[4], respectively, the gates EQ1, EQ2 and EQ3 will output logic 1. If at the same time the enable fuse signal EN is initiated, the redundancy enable signal RED is thus generated. The controlling fuse circuit 262 includes three fuse indication circuits 262' shown in FIG. 8. The fuse indication circuit 262' includes a resistor FSR and a fuse FSF connected in series, and the resistor FSR and the fuse FSF are disposed between the power supply node $V_{cc}$ and the ground node to generate an extra fuse signal FS. Thus, the three fuse indication circuits 262' generate three extra fuse signals FS[0]-FS[2]. The redundancy decoder circuit 263 includes six first coding circuits 263a (refer to FIG. 9(a)), four second coding circuits 263c (refer to FIG. 9(c)) and a third coding circuit 263d (refer to FIG. 9(d)). The six first coding circuits 263a are configured to generate six first signals F[0]-F[5] based on the three extra fuse signals FS[0]-FS[2] and three inverted extra fuse signal FS[0]N-FS[2]N that result from the inverter circuits 263b in FIG. 9(b). The four second coding circuits 263c are configured to generate redundancy selection signal RY[0]-RY[3] based on the three extra fuse signals FS[0]-FS[2], the redundancy enable signal RED, and two bits A[0] and [1] of the logical addresses of the memory blocks. The third coding circuit 263d is configured to generate a column disable signal DISY based on the redundancy selection signals RY[0]-RY[3]. The redundancy decoder circuit 263 further includes five inverters IN8-IN9 and IN221-IN23 to invert the three extra fuse signals FS[0]-FS[2] and the bit values A[0], A[1] of the logical addresses of the memory blocks (refer to FIG. 9(b)).

Table 1 below shows six defective types DT1-DT6 of the memory blocks and their corresponding states of the extra fuse signals FS[0]-FS[2], which is associated with the operation of the first embodiment of the column redundancy selection circuit 26. Referring to FIG. 5(b) and Table 1, in the case of DT1, the adjacent memory blocks 211 and 212, which are marked in Table 1 and exhibit logical addresses of 2 and 0, respectively, and exhibit physical addresses of BL[0] and BL[2], respectively, will be replaced by their corresponding redundancy blocks 221 and 222. Note that in the NAND flash application, one of a pair of bit lines in a memory block (e.g., memory block 211) is commonly used as a shielding bit line selected by its corresponding page buffer, and bit lines BL[1] and BL[3] are shielding bit lines in the current embodiment. However, in other applications of semiconductor memory devices, there may be only one bit line in a memory block. Thus, in the current embodiment, the memory blocks 211 and 212 can be considered adjacent to each other. In the case of DT2, the adjacent memory blocks 213 and 214 will be replaced. In the case of DT4, the adjacent memory blocks 211-213 will be replaced. In the case of DT6, the adjacent memory blocks 211-214 will be replaced. The column of FS[n] indicates the first signals F[0]-F[5], each exhibiting the high logic level and resulting from a logical operation of the three extra fuse signals FS[0]-FS[2] through six first coding circuits 263a in FIG. 9(a).

TABLE 1

| Defective Type | Physical address A[1:0] | | | | Extra fuse signals | | | |
|---|---|---|---|---|---|---|---|---|
| | A[1] = 1, A[0] = 0 | A[1] = 0, A[0] = 0 | A[1] = 0, A[0] = 1 | A[1] = 1, A[0] = 1 | FS[2] | FS[1] | FS[0] | FS[n] |
| DT 1 | 2 | 0 | 1 | 3 | 0 | 0 | 0 | F[0] |
| DT 2 | 2 | 0 | 1 | 3 | 0 | 0 | 1 | F[1] |
| DT 3 | 2 | 0 | 1 | 3 | 0 | 1 | 0 | F[2] |
| DT 4 | 2 | 0 | 1 | 3 | 0 | 1 | 1 | F[3] |
| DT 5 | 2 | 0 | 1 | 3 | 1 | 0 | 0 | F[4] |
| DT 6 | 2 | 0 | 1 | 3 | 1 | 0 | 1 | F[5] |

Figure 7A:
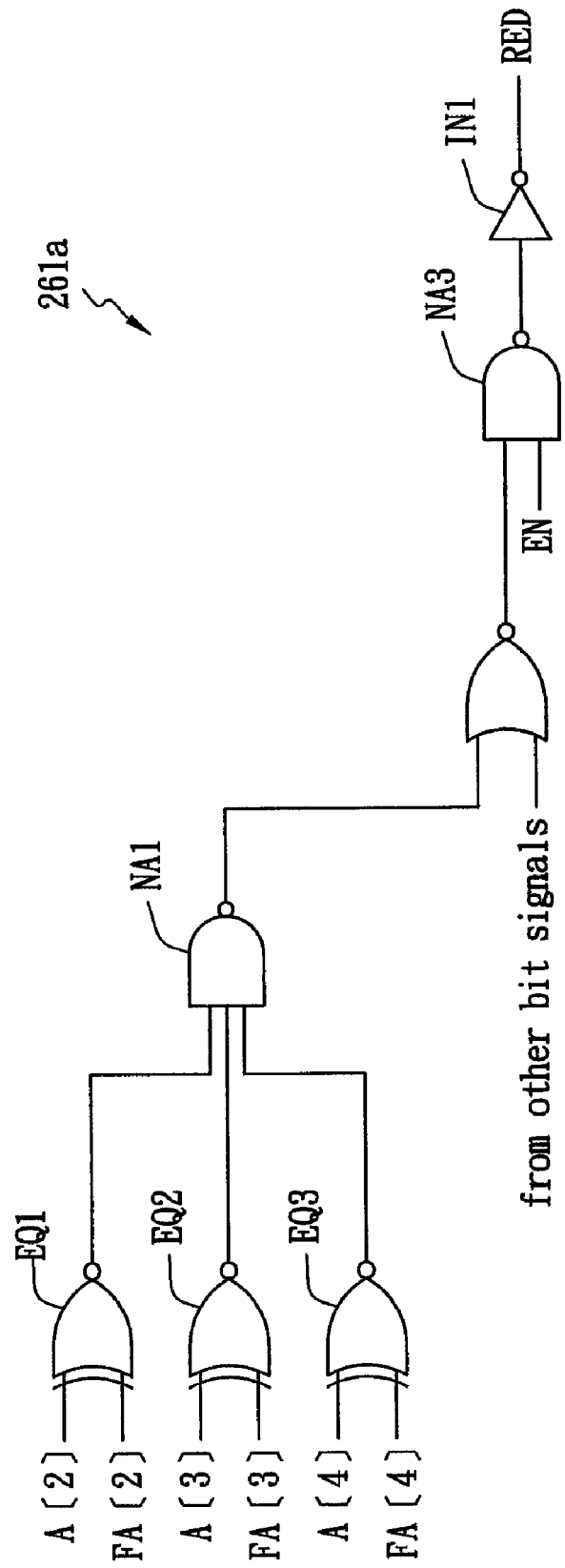
FIG. 7(a) shows an embodiment of a redundancy enable circuit.

The first embodiment of the selection method of bit line redundancy repair according to the present invention will be explained below, accompanied by FIGS. 5(b), 7(a)-7(c), 8, 9(a), and an example of the case of DT4 in Table 1; that is, the memory blocks 211-213 will be replaced. First, three logical address (i.e., 2, 0, and 1) of the memory blocks 211-213 in the normal cell array 21 are provided. That is, the logical address (i.e., 2) of the memory block 211 provides the bit values of A[0]=0 and A[1]=1; the logical address (i.e., 0) of the memory block 212 provides the bit values of A[0]=0 and A[1]=0; the logical address (i.e., 1) of the memory block 213 provides the bit values of A[0]=1 and A[1]=0, wherein A[0] and A[1] are the least two bits of a logical address of each memory block. Second, three extra fuse signals FS[0]-FS[2] are generated by three fuse indication circuits 262' in FIG. 8, in which the three extra fuse signals FS[0], FS[1] and FS[2] are 1 (high), 1(high) and 0 (low), respectively. Third, a code is generated based on the three extra fuse signals FS[0]-FS[2] (obviously, a combination of the three fuse signals FS[0]-FS[2] in Table 1 correspond to a specific code to distinguish the defective type), and the code matches a defective type (i.e., DT4) of the memory blocks 211-213. Fourth, three redundancy blocks 221-223 in the redundancy cell array 22 are selected according to the code to replace the memory blocks 211-213 in the normal cell array 21. The process to select the redundancy blocks 221-223 is described below. The redundancy enable signal RED in FIG. 7(a) is logically high if the enable fuse signal EN in FIG. 7(b) is set logically high and the bit values A[2]-A[4] have the same logical states with the three fuse state signals FA[2]-FA[4], respectively. The memory block 211 has the logical address of 2 and the bit values of A[0]=0 and A[1]=1. Referring to a second coding circuit 263c with an output of the redundancy selection signal RY[2] in FIG. 9(c), the output of the NOR gate NOR4 is logically low due to the logically high level of the first signal F[3] (refer to Table 1 or FIG. 9(a)), and the output of the inverter IN14 is logically high; furthermore, RED=1 (high), A[1]=1 (high), and A[0]N=1 (high). Accordingly, the redundancy selection signal RY[2] is logically high and thus the redundancy block 221 is selected by the redundancy selection signal RY[2] to replace the memory block 211. The memory block 212 has the logical address of 0 and the bit values of A[0]=0 and A[1]=0. Referring to a second coding circuit 263c with an output of the redundancy selection signal RY[0], the output of the NOR gate NOR2 is logically low due to the logically high level of the first signal F[3] (refer to Table 1 or FIG. 9(a)), the output of the inverter IN10 is logically high; also, RED=1 (high), A[1]N=1 (high), and A[0]N=1 (high). Accordingly, the redundancy selection signal RY[0] is logically high and thus the redundancy block 222 is selected by the redundancy selection signal RY[0] to replace the memory block 212. The memory block 213 has the logical address of 1 and the bit values of A[0]=1 and A[1]=0. Referring to a second coding circuit 263c with an output of the redundancy selection signal RY[1], the output of the NOR gate NOR3 is logically low due to the logically high level of the first signal F[3] (refer to Table 1 or FIG. 9(a)), the output of the inverter IN12 is logically high; also, RED=1 (high), A[1]N=1 (high), and A[0]=1 (high). Accordingly, the redundancy selection signal RY[1] is logically high and thus the redundancy block 223 is selected by the redundancy selection signal RY[1] to replace the memory block 213. However, the memory block 214 has the logical address of 3 and the bit values of A[0]=1 and A[1]=1. Referring to a second coding circuit 263c with an output of the redundancy selection signal RY[3], the output of the NOR gate NOR5 is logically high due to the logically low levels of the first signals F[1], F[4] and F[5] (refer to FIG. 9(a)); furthermore, the output of the inverter IN16 is logically low. Accordingly, the redundancy selection signal RY[3] is logically low and the redundancy block 224 is not selected by the redundancy selection signal RY[3] to replace the memory block 214.

The operation of another example of the case of DT6 in Table 1 is given below; that is, the memory blocks 211-214 will be replaced. First, four logical address (i.e., 2, 0, 1 and 3) of the memory blocks 211-214 in the normal cell array 21 are provided. That is, the logical address (i.e., 2) of the memory block 211 provides the bit values of A[0]=0 and A[1]=1; the logical address (i.e., 0) of the memory block 212 provides the bit values of A[0]=0 and A[1]=0; the logical address (i.e., 1) of the memory block 213 provides the bit values of A[0]=1 and A[1]=0; the logical address (i.e., 3) of the memory block 214 provides the bit values of A[0]=1 and A[1]=1. Second, three extra fuse signals FS[0]-FS[2] are generated by three fuse indication circuits 262' in FIG. 8, in which the extra fuse signals FS[0], FS[1] and FS[2] are 1 (high), 0 (low) and 1 (high), respectively. Third, a code is generated from the extra fuse signals FS[0]-FS[2] and the code matches a defective type (i.e., DT6) of the memory blocks 211-214. Fourth, four redundancy blocks 221-224 in the redundancy cell array 22 are selected according to the code to replace the memory blocks 211-214 in the normal cell array 21. The process to select the redundancy blocks 221-224 is described below. The redundancy enable signal RED in FIG. 7(a) is logically high if the enable fuse signal EN in FIG. 7(b) is set logically high and the bit values A[2]-A[4] have the same logical states with the three fuse state signals FA[2]-FA[4], respectively. The memory block 211 has the logical address of 2 and the bit values of A[0]=0 and A[1]=1. Referring to the second coding circuit 263c with an output of the redundancy selection signal RY[2], the output of the NOR gate NOR4 is logically low due to the logically high level of the first signal F[5] (refer to Table 1 or FIG. 9(a)) and the output of the inverter IN14 is logically high; furthermore, RED=1 (high), A[1]=1 (high), and A[0]N=1 (high). Accordingly, the redundancy selection signal RY[2] is logically high and thus the redundancy block 221 is selected by the redundancy selection signal RY[2] to replace the memory block 211. The memory block 212 has the logical address of 0 and the bit values of A[0]=0 and A[1]=0. Referring to the second coding circuit 263c with an output of the redundancy selection signal RY[0], the output of the NOR gate NOR2 is logically low due to the logically high level of the first signal F[5] (refer to Table 1 or FIG. 9(a)) and the output of the inverter IN10 is logically high; also, RED=1 (high), A[1]N=1 (high), and A[0]N=1 (high). Accordingly, the redundancy selection signal RY[0] is logically high and thus the redundancy block 222 is selected by the redundancy selection signal RY[0] to replace the memory block 212. The memory block 213 has the logical address of 1 and the bit values of A[0]=1 and A[1]=0. Referring to the second coding circuit 263c with an output of the redundancy selection signal RY[1], the output of the NOR gate NOR3 is logically low due to the logically high level of the first signal F[5] (refer to Table 1 or FIG. 9(a)) and the output of the inverter IN12 is logically high; also, RED=1 (high), A[1]N=1 (high), and A[0]=1 (high). Accordingly, the redundancy selection signal RY[1] is logically high and thus the redundancy block 223 is selected by the redundancy selection signal RY[1] to replace the memory block 213. The memory block 214 has the logical address of 3 and the bit values of A[0]=1 and A[1]=1. Referring to the second coding circuit 263c with an output of the redundancy selection signal RY[3], the output of the NOR gate NOR5 is logically low due to the logically high level of the first signal F[5] (refer to Table 1 or FIG. 9(a)) and the output of the inverter IN16 is logically high; again, RED=1 (high), A[1]=1 (high), and A[0]=1 (high). Accordingly, the redundancy selection signal RY[3] is logically high and thus the redundancy block 224 is selected by the redundancy selection signal RY[3] to replace the memory block 214. For other cases of DT1-DT3 and DT5 in Table 1, their operations are similar to those of the cases of DT4 and DT6 and thus are not described herein. According to Table 1 and FIG. 5(b), the memory blocks being two adjacent defective memory blocks (i.e., DT1-DT3), three adjacent defective memory blocks (i.e., DT4-DT5) or four adjacent defective memory blocks (i.e., DT6) can be replaced by the first embodiment of the column redundancy selection circuit 26 with few fuses. Referring to FIG. 7(a), if EQ1, EQ2, and EQ3 must be used, otherwise, the redundancy will repair multiple bit lines with different A[2:4]. Therefore, only seven fuses are used (four fuses F1 in FIG. 7(b) and three fuses FSF in FIG. 8); however, nine fuses are used in '244 (refer to FIGS. 6A and 6B). Accordingly, the present invention is very flexible to repair the six defective types in Table 1.

Figure 11:
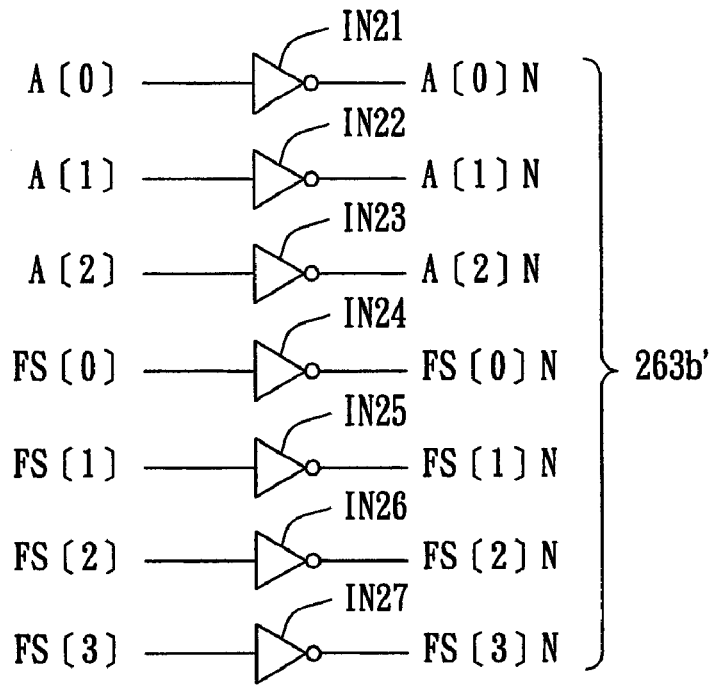
FIG. 11 shows another embodiment of inverter circuits.
Figure 12:
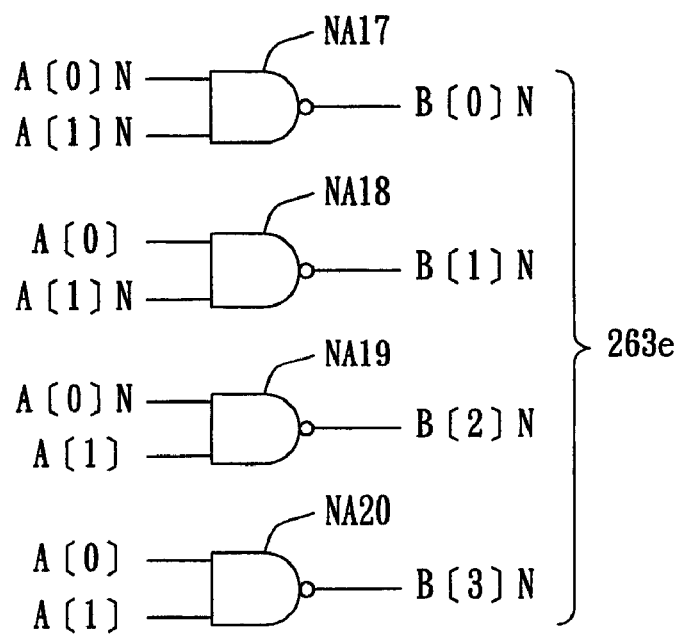
FIG. 12 shows four fourth coding circuits.
Figure 13A:
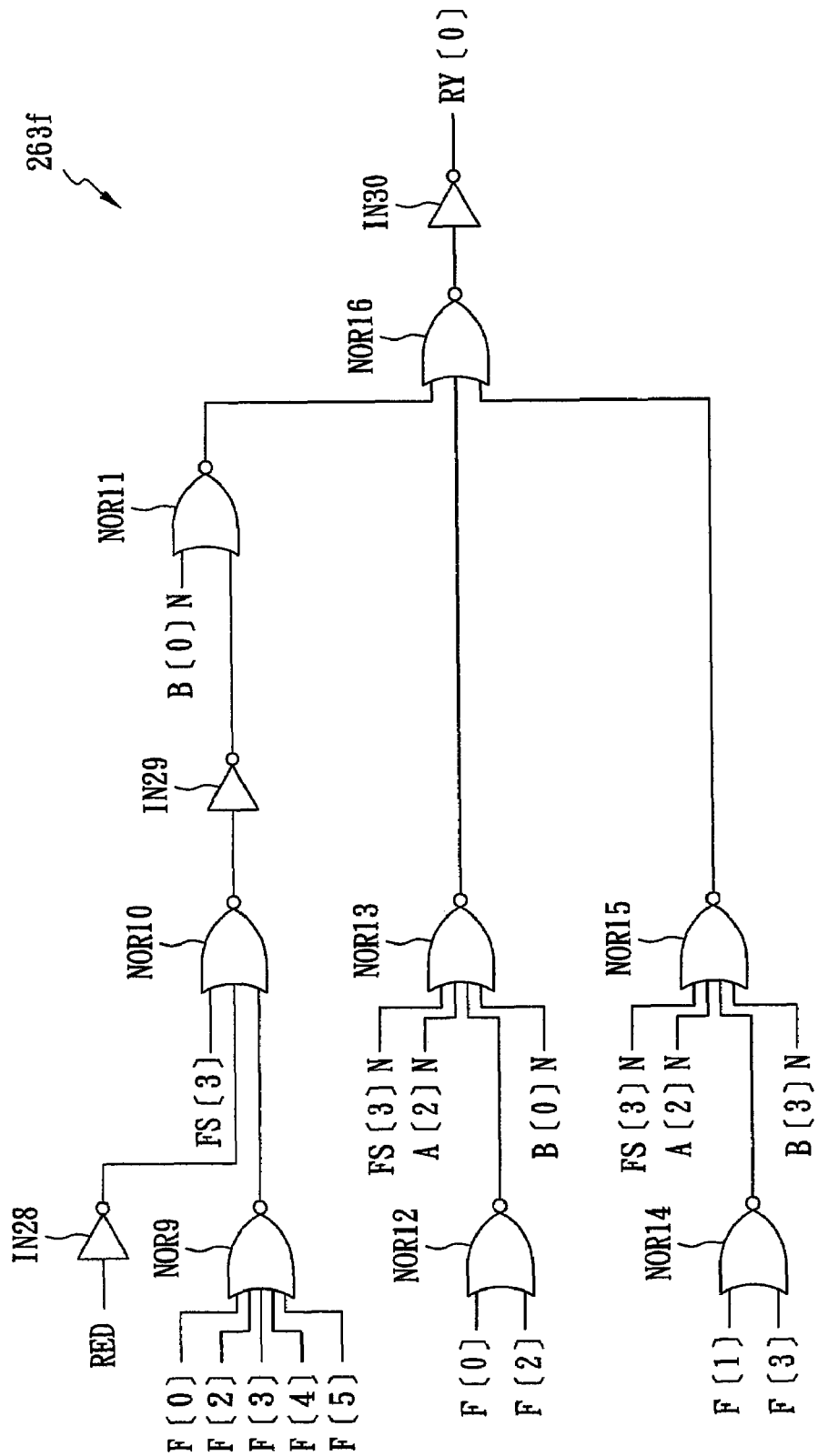
FIGS. 13(a)-13(d) shows four fifth coding circuits.
Figure 13B:
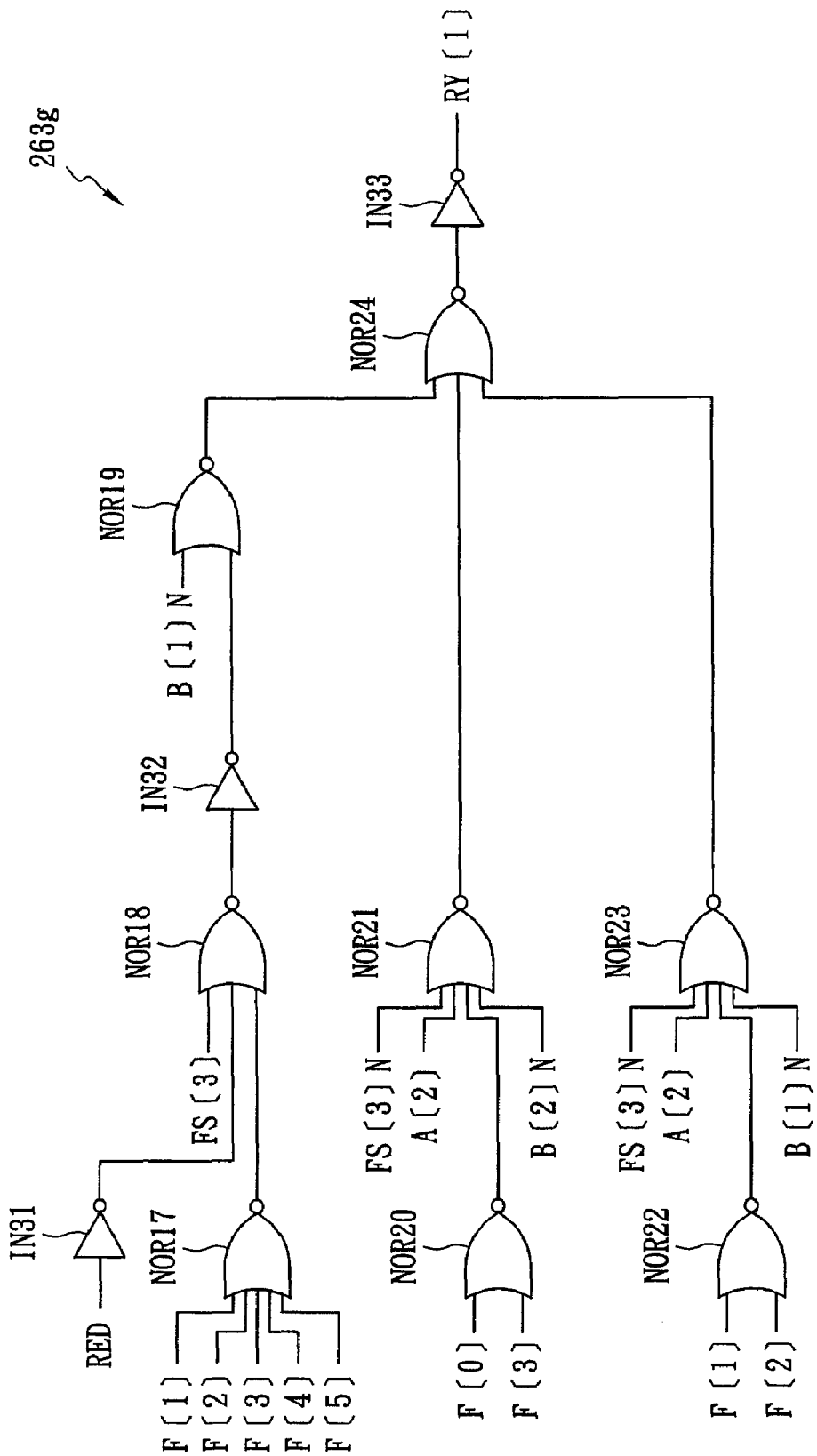
Figure 13C:
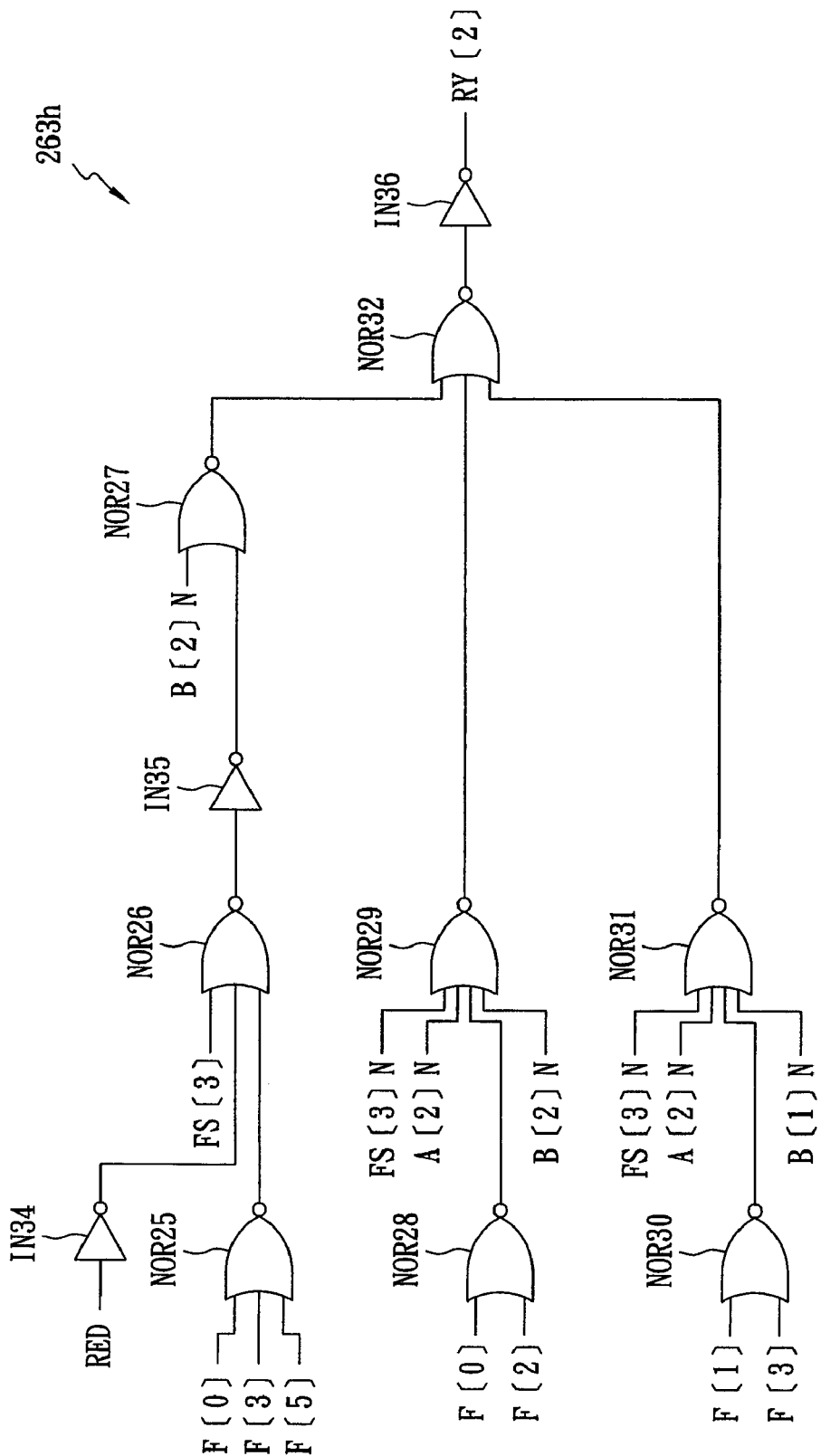
Figure 13D:
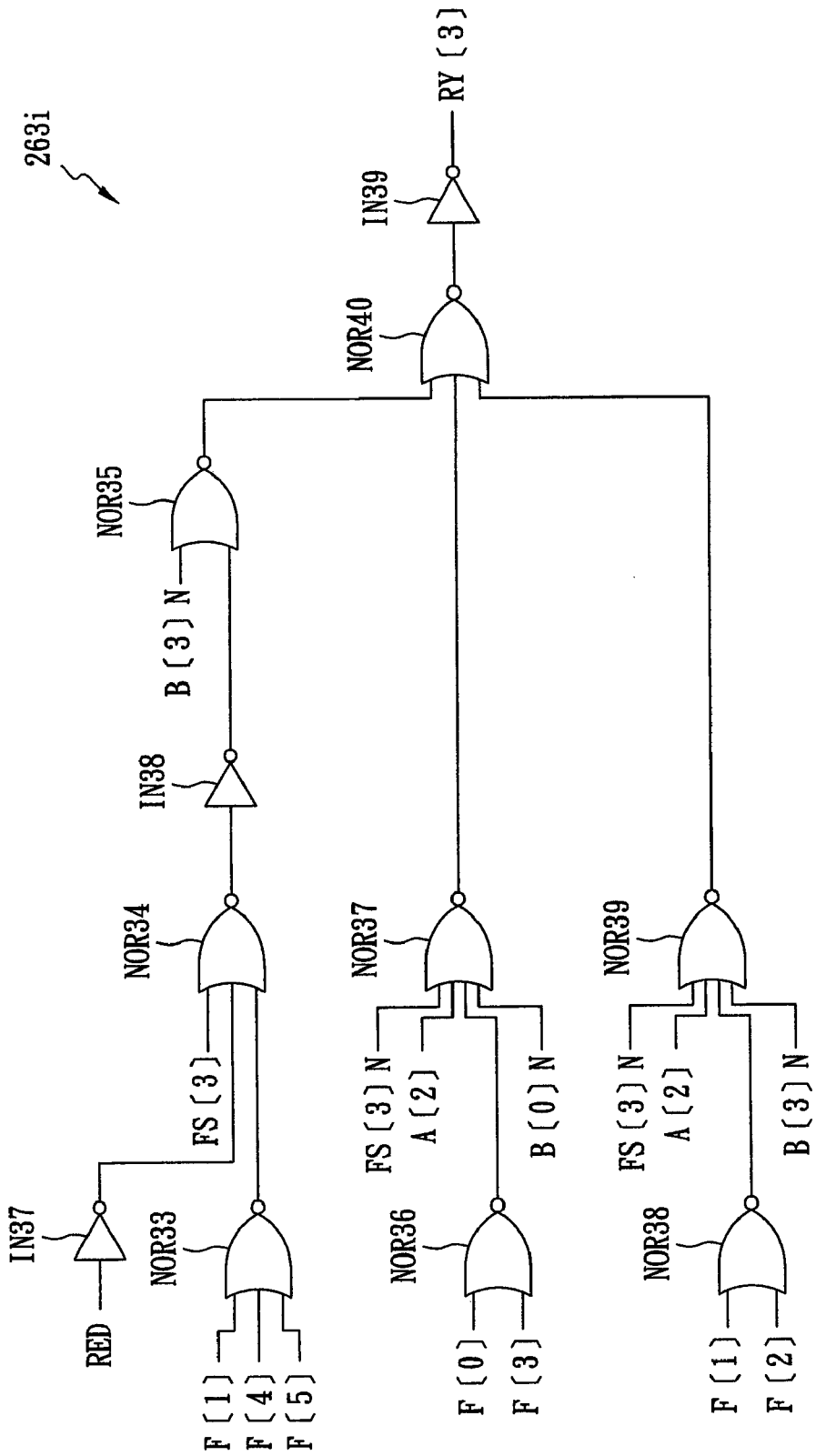

For the second embodiment of the column redundancy selection circuit 26' in FIG. 6, which is applied to the semiconductor memory device 2' in FIG. 5(c), according to the present invention, the redundancy repair enable circuit 261' includes a redundancy enable circuit 261a' (refer to FIG. 10), an enable fuse circuit 261b' (refer to FIG. 7(b)), and three fuse state circuits 261c' (refer to FIG. 7(c)). The redundancy enable circuit 261a' receives the enable fuse signal EN, the fuse state signals FA[2]-FA[4], an extra fuse signal FS[3] and three bits A[2]-A[4] of the logical addresses (indicated as ADD1 in FIG. 6) of the memory blocks. Similarly to FIG. 7(a), when the bit A[2] is equal to the fuse state signal FA[2], the bit A[3] is equal to the fuse state signal FA[3], and the bit A[4] is equal to the fuse state signal FA[4], respectively, the gates EQ6, EQ8 and EQ9 will output logic 1. However, in contrast to FIG. 7(a), FS[3] is added to initiate one input of the gate NA15 even if the gate EQ6 outputs logic 0. If at the same time the enable fuse signal EN is initiated, the redundancy enable signal RED is thus generated. Note that the signal flow of the extra fuse signal FS[3] from the controlling fuse circuit 262' to the redundancy repair enable circuit 261' is not shown in FIG. 6. The controlling fuse circuit 262' includes four fuse indication circuits 262" shown in FIG. 8 to generate four extra fuse signals FS[0]-FS[3]. The redundancy decoder circuit 263' includes six first coding circuits 263a' (refer to FIG. 9(a)), four fourth coding circuits 263e (refer to FIG. 12), and four fifth coding circuits 263f-263i (refer to FIGS. 13(a)-13(d)). The six first coding circuits 263a' are configured to generate six first signals F[0]-F[5] based on three extra fuse signals FS[0]-FS[2] and three inverted extra fuse signal FS[0]N-FS[2]N that come from the inverter circuits 263b' in FIG. 11. Each of the four fourth coding circuits 263e generates a second signal B[n]N based on two bits (i.e., A[0] and A[1]) of the logical addresses of the memory blocks. The fifth coding circuits 263f-263i generate the redundancy selection signals RY[0]-RY[3] based on the six first signals F[0]-F[5] and the four second signals B[0]N-B[3]N. The redundancy decoder circuit 263' further includes an eighth coding circuit 263d' (refer to FIG. 9(d)) generating the column disable signal DISY based on the redundancy selection signals RY[0]-RY[3]. In addition, the redundancy decoder circuit 263' further includes seven inverters IN21-IN27 to invert the four extra fuse signals FS[0]-FS[3] and the bit values A[0]-A[2] of the logical addresses of the memory blocks (refer to FIG. 11).

Table 2 below shows sixteen defective types DT11-DT26 of the memory blocks and their corresponding states of the extra fuse signals FS[0]-FS[3] associated with the operation of the second embodiment of the column redundancy selection circuit 26'. Referring to FIG. 5(c) and Table 2, in the case of DT11, the adjacent memory blocks 215' and 216', which are marked and exhibit logical addresses of 2 and 0, respectively, and with physical addresses of BL[4] and BL[5], respectively, will be replaced by their corresponding redundancy blocks 221' and 222'. In the case of DT16, the adjacent memory blocks 215'-218' will be replaced. In the case of DT23, two separate groups of the adjacent memory blocks 211' and 212', 215' and 216' will be replaced. In the case of DT24, two separate groups of the adjacent memory blocks 213' and 214', 217' and 218' will be replaced. In the case of DT25, two separate groups of the adjacent memory blocks 211' and 212', 217' and 218' will be replaced. In the case of DT26, the four adjacent memory blocks 213'-216', which cross two memory areas with A[2]=1 and A[2]=0, will be replaced. The column of FS[n] indicates the first signals F[0]-F[5], each exhibiting the high logic level and resulting from the logical operation of the extra fuse signals FS[0]-FS[2] through six first coding circuits 263a in FIG. 9(a).

TABLE 2

| Defective Type | Physical address A[2:0] | | | | | | | | Extra fuse signals | | | | F[n] |
|---|---|---|---|---|---|---|---|---|---|---|---|---|---|
| | A[2] = 1 | | | | A[2] = 0 | | | | | | | | |
| | A[1]=1 A[0]=0 | A[1]=0 A[0]=0 | A[1]=0 A[0]=1 | A[1]=1 A[0]=1 | A[1]=1 A[0]=0 | A[1]=0 A[0]=0 | A[1]=0 A[0]=1 | A[1]=1 A[0]=1 | FS[3] | FS[2] | FS[1] | FS[0] | |
| DT11 | 6 | 4 | 5 | 7 | 2 | 0 | 1 | 3 | 0 | 0 | 0 | 0 | F[0] |
| DT12 | 6 | 4 | 5 | 7 | 2 | 0 | 1 | 3 | 0 | 0 | 0 | 1 | F[1] |
| DT13 | 6 | 4 | 5 | 7 | 2 | 0 | 1 | 3 | 0 | 0 | 1 | 0 | F[2] |
| DT14 | 6 | 4 | 5 | 7 | 2 | 0 | 1 | 3 | 0 | 0 | 1 | 1 | F[3] |
| DT15 | 6 | 4 | 5 | 7 | 2 | 0 | 1 | 3 | 0 | 1 | 0 | 0 | F[4] |
| DT16 | 6 | 4 | 5 | 7 | 2 | 0 | 1 | 3 | 0 | 1 | 0 | 1 | F[5] |
| DT17 | 6 | 4 | 5 | 7 | 2 | 0 | 1 | 3 | 0 | 0 | 0 | 0 | F[0] |
| DT18 | 6 | 4 | 5 | 7 | 2 | 0 | 1 | 3 | 0 | 0 | 0 | 1 | F[1] |
| DT19 | 6 | 4 | 5 | 7 | 2 | 0 | 1 | 3 | 0 | 0 | 1 | 0 | F[2] |
| DT20 | 6 | 4 | 5 | 7 | 2 | 0 | 1 | 3 | 0 | 0 | 1 | 1 | F[3] |
| DT21 | 6 | 4 | 5 | 7 | 2 | 0 | 1 | 3 | 0 | 1 | 0 | 0 | F[4] |
| DT22 | 6 | 4 | 5 | 7 | 2 | 0 | 1 | 3 | 0 | 1 | 0 | 1 | F[5] |
| DT23 | 6 | 4 | 5 | 7 | 2 | 0 | 1 | 3 | 1 | 0 | 0 | 0 | F[0] |
| DT24 | 6 | 4 | 5 | 7 | 2 | 0 | 1 | 3 | 1 | 0 | 0 | 1 | F[1] |
| DT25 | 6 | 4 | 5 | 7 | 2 | 0 | 1 | 3 | 1 | 0 | 1 | 0 | F[2] |
| DT26 | 6 | 4 | 5 | 7 | 2 | 0 | 1 | 3 | 1 | 0 | 1 | 1 | F[3] |

Figure 10:
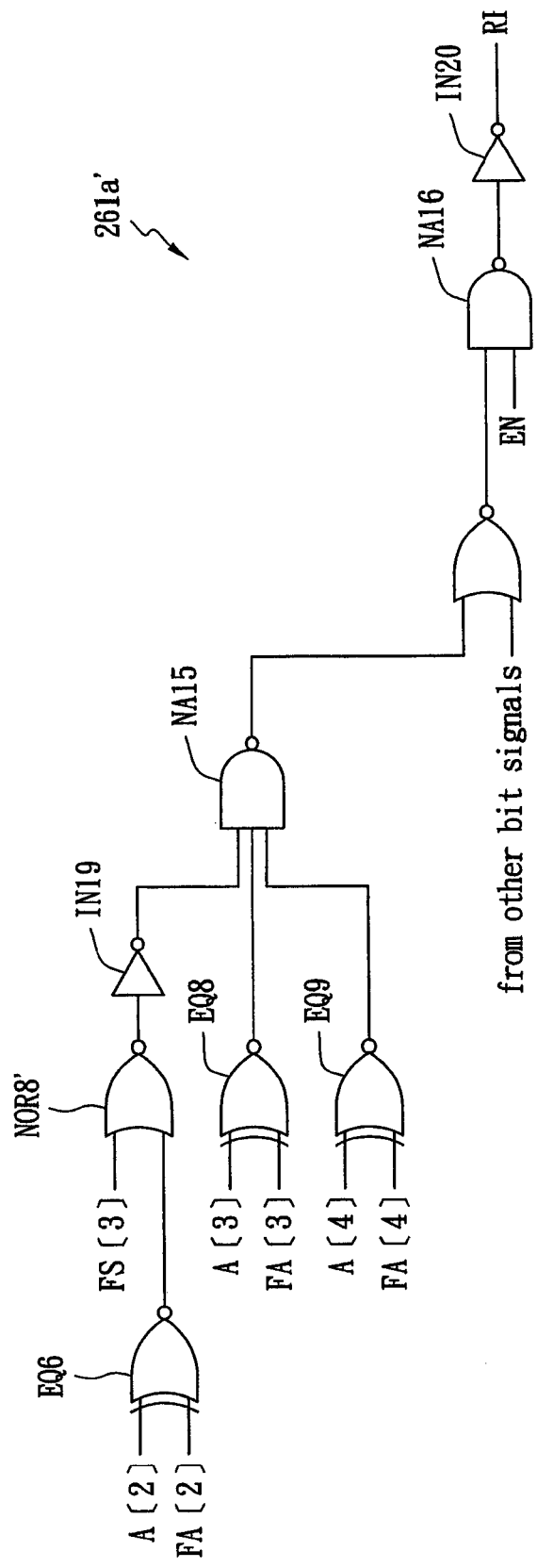
FIG. 10 shows another embodiment of a redundancy enable circuit.

The second embodiment of the selection method of bit line redundancy repair according to the present invention can repair the cases of DT11-DT16 with A[2] at low logic state and can repair the cases of DT17-DT22 with A[2] at high logic state. Therefore, the fuse state signal FA[2] is needed to decide the repair is performed based on A[2] at low logic state or at high logic state (refer to FIG. 10). The second embodiment also can repair the cases of DT23-DT26 with FS[3] at high logic state, in which two bit lines with A[2] at low logic state or at high logic state. Also, the states of RY[2], RY[0], RY[1], and RY[3] can be assigned to (6,4,2,0) for the case of DT23, (5,7,1,3) for the case of DT24, (6,4,1,3) for the case of DT25, and (5,7,2,0) for the case of DT26; that is, for each case of DT23-DT26, its corresponding states of RY[2], RY[0], RY[1], and RY[3] can be assigned to the corresponding logical address marked in Table 2 sequentially. The second embodiment will be explained below, accompanied by FIGS. 5(c), 7(a)-7(c), 8, 9(a), 10, 11, 12 and 13(a)-13(d), and an example of the case of DT16 in Table 2; that is, the memory blocks 215'-218' will be replaced. First, four logical address (i.e., 2, 0, 1 and 3) of the memory blocks 215'-218' in the normal cell array 21' are provided. That is, the logical address (i.e., 2) of the memory block 215' provides the bit values of A[0]=0, A[1]=1 and A[2]=0; the logical address (i.e., 0) of the memory block 216' provides the bit values of A[0]=0, A[1]=0 and A[2]=0; the logical address (i.e., 1) of the memory block 217' provides the bit values of A[0]=1, A[1]=0 and A[2]=0; the logical address (i.e., 3) of the memory block 218' provides the bit values of A[0]=1, A[1]=1 and A[2]=0, wherein A[0]-A[2] are the least three bits of a logical address of a memory block. Second, four extra fuse signals FS[0]-FS[3] are generated by four fuse indication circuits 262'' in FIG. 8, in which the four extra fuse signals FS[0], FS[1], FS[2] and FS[3] are 1 (high), 0 (low), 1 (high) and 0 (low), respectively. Third, a code is generated based on the four extra fuse signals FS[0]-FS[3] and a bit A[2] of the logical addresses of the memory blocks 211'-218' (obviously, a combination of the bit A[2] and the four fuse signals FS[0]-FS[3] in Table 2 correspond to a specific code to distinguish the defective type), and the code matches a defective type (i.e., DT16) of the memory blocks 211'-218'. Fourth, four redundancy blocks 221'-224' in the redundancy cell array 22' are selected according to the code to replace the memory blocks 215'-218' in the normal cell array 21'. The process to select the redundancy blocks 221'-224' is described below. The redundancy enable signal RED in FIG. 10 is logically high if the enable fuse signal EN in FIG. 7(b) is set logically high, the output of the logic gate EQ6 (refer to FIG. 10) is logically high and the bit values A[2]-A[4] have the same logical states with the three fuse state signals FA[2]-FA[4], respectively. The memory block 215' has the logical address of 2 and the bit values of A[0]=0, A[1]=1 and A[2]=0. Referring to a fifth coding circuit 263h, the output of the NOR gate NOR25 is logically low due to the logically high level of the first signal F[5] (refer to Table 2 or FIG. 9(a)), the logically low level of the output of the inverter IN34, and FS[3]=0, resulting in the output of the inverter IN35 being logically low; also, the second signal B[2]N is logically low (refer to FIG. 12) and the output of the NOR gate NOR27 is logically high. Accordingly, the redundancy selection signal RY[2] is logically high. The memory block 216' has the logical address of 0 and the bit values of A[0]=0, A[1]=0 and A[2]=0. Referring to a fifth coding circuit 263f, the output of the NOR gate NOR9 is logically low due to the logically high level of the first signal F[5] (refer to Table 2 or FIG. 9(a)), the logically low level of the output of the inverter IN28, and FS[3]=0, resulting in the output of the inverter IN29 being logically low; also, the second signal B[0]N is logically low (refer to FIG. 12) and then the output of the NOR gate NOR11 is logically high. Accordingly, the redundancy selection signal RY[0] is logically high. The memory block 217' has the logical address of 1 and the bit values of A[0]=1, A[1]=0 and A[2]=0. Referring to a fifth coding circuit 263g, the output of the NOR gate NOR17 is logically low due to the logically high level of the first signal F[5] (refer to Table 2 or FIG. 9(a)), the logically low level of the output of the inverter IN31, and FS[3]=0, resulting in the output of the inverter IN32 being logically low; also, the second signal B[1]N is logically low (refer to FIG. 12) and then the output of the NOR gate NOR19 is logically high. Accordingly, the redundancy selection signal RY[1] is logically high. The memory block 218' has the logical address of 3 and the bit values of A[0]=1, A[1]=1 and A[2]=0. Referring to a fifth coding circuit 263i, the output of the NOR gate NOR33 is logically low due to the logically high level of the first signal F[5] (refer to Table 2 or FIG. 9(a)), the logically low level of the output of the inverter IN37, and FS[3]=0, resulting in the output of the inverter IN38 being logically low; also, the second signal B[3]N is logically low (refer to FIG. 12) and then the output of the NOR gate NOR35 is logically high. Accordingly, the redundancy selection signal RY[3] is logically high. Therefore, the redundancy selection signals RY[0]-RY[3] could be activated high by the code matching the defective type of DT16, in which the code is generated based on the states of the four extra fuse signals FS[0]-FS[3] and the bit A[2]. Consequently, the redundancy blocks 221'-224' are selected to replace the memory blocks 215'-218'. The operation of each case of DT11-DT15 and DT17-22 is similar to that of the case of DT16, and is therefore not described herein.

The operation of another example of the case of DT24 in Table 2 is described below; that is, the memory blocks 213'-214' and 217'-218' will be replaced. First, four logical addresses (i.e., 5, 7, 1 and 3) of the memory blocks 213'-214' and 217'-218' in the normal cell array 21' are provided. That is, the logical address (i.e., 5) of the memory block 213' provides the bit values of A[Q]=1, A[1]=0 and A[2]=1; the logical address (i.e., 7) of the memory block 214' provides the bit values of A[0]=1, A[1]=1 and A[2]=1; the logical address (i.e., 1) of the memory block 217' provides the bit values of A[0]=1, A[1]=0 and A[2]=0; the logical address (i.e., 3) of the memory block 218' provides the bit values of A[0]=1, A[1]=1 and A[2]=0. Second, four extra fuse signals FS[0]-FS[3] are generated by four fuse indication circuits 262" in FIG. 8, in which the four extra fuse signals FS[0], FS[1], FS[2] and FS[3] are 1 (high), 0 (low), 0 (low) and 1 (high), respectively. Third, a code is generated based on the four extra fuse signals FS[0]-FS[3] and the bit A[2] of the logical addresses of the memory blocks 213'-214' and 217'-218' (obviously, a combination of the four fuse signals FS[0]-FS[3] in Table 2 corresponds to a specific code to distinguish the defective type), and the code matches a defective type (i.e., DT24) of the memory blocks 213'-214' and 217'-218'. Fourth, four redundancy blocks 221'-224' in the redundancy cell array 22' are selected according to the code to replace the memory blocks 213'-214' and 217'-218' in the normal cell array 21'. The process to select the redundancy blocks 221'-224' is described below. The redundancy enable signal RED in FIG. 10 is logically high if the enable fuse signal EN in FIG. 7(b) is set logically high, the output of the logic gate NOR8' (refer to FIG. 10) is logically low (since FS[3] is logically high) and the bit values A[3]-A[4] have the same logical states with the three fuse state signals FA[3]-FA[4], respectively. The memory block 213' has the logical address of 5 and the bit values of A[0]=1, A[1]=0 and A[2]=1. Referring to the fifth coding circuit 263h, the output of the NOR gate NOR31 is logically high due to the logically low level of each of the signals FS[3]N, A[2]N, B[1]N, and the output of the NOR gate NOR31, resulting in high logic state of the redundancy selection signal RY[2]. The memory block 214' has the logical address of 7 and the bit values of A[0]=1, A[1]=1 and A[2]=1. Referring to a fifth coding circuit 263f, the output of the NOR gate NOR15 is logically high due to the logically low level of each of the signals FS[3]N, A[2]N, B[3]N, and the output of the NOR gate NOR14, resulting in high logic state of the redundancy selection signal RY[0]. The memory block 217' has the logical address of 1 and the bit values of A[0]=1, A[1]=0 and A[2]=0. Referring to a fifth coding circuit 263g, the output of the NOR gate NOR23 is logically high due to the logically low level of each of the signals FS[3]N, A[2], B[1]N, and the output of the NOR gate NOR22, resulting in high logic state of the redundancy selection signal RY[1]. The memory block 218' has the logical address of 3 and the bit values of A[0]=1, A[1]=1 and A[2]=0. Referring to the fifth coding circuit 263i, the output of the NOR gate NOR39 is logically high due to the logically high level of each of the signals FS[3]N, A[2], B[3]N, and the output of the NOR gate NOR38, resulting in high logic state of the redundancy selection signal RY[3]. Therefore, the redundancy selection signals RY[0]-RY[3] could be activated high by the code matching the defective type of DT24, in which the code is generated based on the states of the four extra fuse signals FS[0]-FS[3] and the bit A[2]. Consequently, the redundancy blocks 221'-224' are selected to replace the memory blocks 213'-214' and 217'-218'. The operation of each of the cases of DT23, DT25 and DT26 is similar to that of the case of DT24, and is not described herein.

According to Table 2 and FIG. 5(c), the memory blocks being two adjacent defective memory blocks (e.g., DT11-DT13, DT17-19), three adjacent defective memory blocks (e.g., DT14-DT15, DT20-DT21), four adjacent defective memory blocks (e.g., DT16, DT22 and DT26), or four defective memory blocks divided physically into two groups (e.g., DT23-DT25) can be replaced by the second embodiment of the column redundancy selection circuit 26' with few fuses. Therefore, only eight fuses are used (one in FIG. 7(b), three in FIG. 7(c) and four in FIG. 8); however, more than nine fuses will be used in '244. In addition, the present invention can perform flexible bit line redundancy repair. That is, the arrangements of the memory blocks to be replaced (or repaired) by the present invention could exhibit diverse types, including two adjacent memory blocks, three adjacent memory blocks, four adjacent memory blocks and two separate groups of the two adjacent memory blocks that cover the bit values of A[2]=1 and A[2]=0. Furthermore, the present invention could be applied to word line redundancy repair, in which the memory block and the redundancy block in FIG. 5(b) or 5(c) are modified to include two word lines and two redundancy word lines, respectively. Although the number of word lines or bit lines in each of the memory blocks and the redundancy blocks is two in the above-mentioned embodiments, it can be extended to be above two, depending on the application of the memory device.

The above-described embodiments of the present invention are intended to be illustrative only. Numerous alternative embodiments may be devised by those skilled in the art without departing from the scope of the following claims.

What is claimed is:

1. An apparatus performing bit line redundancy repair in a normal cell array having memory blocks and a redundancy cell array having redundancy blocks, the apparatus comprising:
   a redundancy repair enable circuit configured to generate a redundancy enable signal based on logical addresses of the memory blocks;
   a controlling fuse circuit configured to send a code matching a defective type of the memory blocks, wherein the defective type is one of exactly two adjacent defective memory blocks, exactly three adjacent defective memory blocks, exactly four adjacent defective memory blocks and exactly two adjacent defective memory blocks plus another exactly two adjacent defective memory blocks; and
   a redundancy decoder circuit configured to receive the redundancy enable signal and the code to replace a plurality of memory blocks in the normal cell array with a plurality of redundancy blocks in the redundancy cell array.

2. The apparatus performing bit line redundancy repair of claim 1, wherein the memory blocks comprise four defective memory blocks divided physically into two groups.

3. The apparatus performing bit line redundancy repair of claim 1, wherein each of the redundancy blocks comprises plural bit lines and a plurality of redundancy memory cells associated with the plural bit lines.

4. The apparatus performing bit line redundancy repair of claim 1, wherein each of the redundancy blocks comprises plural word lines and a plurality of redundancy memory cells associated with the plural word lines.

5. The apparatus performing bit line redundancy repair of claim 1, wherein the redundancy repair enable circuit comprises:
   an enable fuse circuit configured to generate an enable fuse signal;
   a plurality of fuse state circuits configured to generate a plurality of fuse state signals; and
   a redundancy enable circuit configured to receive the enable fuse signal, the fuse state signals and the logical addresses of the memory blocks to generate the redundancy enable signal.

6. The apparatus performing bit line redundancy repair of claim 5, wherein each of the redundancy enable circuits further receives an extra fuse signal to generate the redundancy enable signal.

7. The apparatus performing bit line redundancy repair of claim 1, wherein the controlling fuse circuit generates a plurality of extra fuse signals, and the code is determined by a combination of states of the extra fuse signals.

8. The apparatus performing bit line redundancy repair of claim 7, wherein the code is determined by a combination of the states of the extra fuse signals and a bit of the logical address of the memory blocks.

9. The apparatus performing bit line redundancy repair of claim 7, wherein the redundancy decoder circuit comprises:
   a plurality of first coding circuits configured to generate a plurality of first signals based on the extra fuse signals; and
   a plurality of second coding circuits configured to generate the redundancy selection signals based on the extra fuse signals, the redundancy enable signal and the logical addresses of the memory blocks; and
   a third coding circuit configured to generate a column disable signal based on the redundancy selection signals.

10. The apparatus performing bit line redundancy repair of claim 7, wherein the redundancy decoder circuit comprises:
    a plurality of first coding circuits configured to generate a plurality of first signals based on the extra fuse signals;
    a plurality of fourth coding circuits, each generating a second signal based on two bits of the logical addresses of the memory blocks;
    a plurality of fifth coding circuits, each generating one of the redundancy selection signals based on the first signals, the second signal, and one of the extra fuse signals; and
    an eighth coding circuit configured to generate a column disable signal based on the redundancy selection signals.

11. A selection method of bit line redundancy repair, which is applied to a normal cell array having memory blocks and a redundancy cell array having redundancy blocks, comprising the steps of:
    providing a plurality of logical addresses of the memory blocks in the normal cell array;
    generating a plurality of extra fuse signals;
    generating a code based on states of the extra fuse signals, the code matching a defective type of the memory blocks, wherein the defective type is one of exactly two adjacent defective memory blocks, exactly three adjacent defective memory blocks, exactly four adjacent defective memory blocks and exactly two adjacent defective memory blocks plus another exactly two adjacent defective memory blocks; and
    selecting a plurality of redundancy blocks in the redundancy cell array to replace the memory blocks according to the code.

12. The selection method of bit line redundancy repair of claim 11, wherein the memory blocks comprise four defective memory blocks divided physically into two groups.

13. The selection method of bit line redundancy repair of claim 11, wherein each of the redundancy blocks comprises plural bit lines and a plurality of redundancy memory cells associated with the plural bit lines.

14. The selection method of bit line redundancy repair of claim 1 wherein each of the redundancy blocks comprises plural word lines and a plurality of redundancy memory cells associated with the plural word lines.

15. The selection method of bit line redundancy repair of claim 11, wherein the code is generated further based on a bit of logical addresses of the memory blocks in the normal cell array.

16. An apparatus performing bit line redundancy repair in a normal cell array having memory blocks and a redundancy cell array having redundancy blocks, the apparatus comprising:
    a redundancy repair enable circuit configured to generate a redundancy enable signal based on logical addresses of the memory blocks;
    means for configuring defective types of the memory blocks, wherein the defective types consist essentially of two adjacent defective memory blocks, three adjacent defective memory blocks, four adjacent defective memory blocks and two adjacent defective memory blocks plus another two adjacent defective memory blocks;

means for sending a code matching one of the defective types; and a redundancy decoder circuit configured to receive the redundancy enable signal and the code to replace a plurality of memory blocks in the normal cell array with a plurality of redundancy blocks in the redundancy cell array.

17. The apparatus performing bit line redundancy repair of claim 16, wherein the memory blocks comprise four defective memory blocks divided physically into two groups.

18. The apparatus performing bit line redundancy repair of claim 16, wherein each of the redundancy blocks comprises plural bit lines and a plurality of redundancy memory cells associated with the plural bit lines.

19. The apparatus performing bit line redundancy repair of claim 16, wherein each of the redundancy blocks comprises plural word lines and a plurality of redundancy memory cells associated with the plural word lines.

20. The apparatus performing bit line redundancy repair of claim 16, wherein the redundancy decoder circuit comprises:

a plurality of first coding circuits configured to generate a plurality of first signals based on the extra fuse signals; and a plurality of second coding circuits configured to generate the redundancy selection signals based on the extra fuse signals, the redundancy enable signal and the logical addresses of the memory blocks; and a third coding circuit configured to generate a column disable signal based on the redundancy selection signals.

* * * * *